United States Patent
Guo et al.

(10) Patent No.: US 11,487,389 B2
(45) Date of Patent: Nov. 1, 2022

(54) FINGERPRINT RECOGNITION MODULE, DRIVING METHOD THEREOF, MANUFACTURING METHOD THEREOF AND DISPLAY DEVICE

(71) Applicant: BOE TECHNOLOGY GROUP CO., LTD., Beijing (CN)

(72) Inventors: Yuzhen Guo, Beijing (CN); Yingming Liu, Beijing (CN); Haisheng Wang, Beijing (CN); Peixiao Li, Beijing (CN); Chenyang Zhang, Beijing (CN); Xiufeng Li, Beijing (CN); Lijun Zhao, Beijing (CN); Yanling Han, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 286 days.

(21) Appl. No.: 16/642,804

(22) PCT Filed: Sep. 12, 2019

(86) PCT No.: PCT/CN2019/105749
§ 371 (c)(1),
(2) Date: Feb. 27, 2020

(87) PCT Pub. No.: WO2020/155645
PCT Pub. Date: Aug. 6, 2020

(65) Prior Publication Data
US 2021/0019018 A1   Jan. 21, 2021

(30) Foreign Application Priority Data

Jan. 28, 2019   (CN) .......................... 201910082585.9

(51) Int. Cl.
*G06F 3/044* (2006.01)
*G06F 3/043* (2006.01)
(Continued)

(52) U.S. Cl.
CPC .......... *G06F 3/0436* (2013.01); *G06F 3/0433* (2013.01); *G06F 3/0445* (2019.05);
(Continued)

(58) Field of Classification Search
CPC .. G06F 3/0436; G06F 3/0445; G06F 3/04164; G06F 3/0433; G06F 2203/04103;
(Continued)

(56) References Cited

U.S. PATENT DOCUMENTS 9,830,855 B1   11/2017   Li
2008/0084457 A1   4/2008   Hibi et al.
(Continued)

FOREIGN PATENT DOCUMENTS

CN   103927468 A   7/2014
CN   104809431 A   7/2015
(Continued)

OTHER PUBLICATIONS

Notice of Allowance for U.S. Appl. No. 16/771,140 dated Apr. 12, 2022.

*Primary Examiner* — Towfiq Elahi
(74) *Attorney, Agent, or Firm* — The Webb Law Firm

(57) ABSTRACT

The present disclosure provides a fingerprint recognition module, a driving method thereof, a manufacturing method thereof, and a display device. The fingerprint recognition module includes a receiving electrode layer, a piezoelectric material layer, and a driving electrode layer. The receiving electrode layer includes a plurality of receiving electrodes arranged in an array along a first direction and a second direction. The piezoelectric material layer is disposed on a side of the receiving electrode layer. The driving electrode layer is disposed on a side of the piezoelectric material layer remote from the receiving electrode layer and includes a plurality of driving electrodes arranged along the second
(Continued)

direction. Each driving electrode is a strip electrode extending along the first direction, and overlaps with multiple receiving electrodes arranged along the first direction.

18 Claims, 13 Drawing Sheets

(51) Int. Cl.
| | | |
|---|---|---|
| H01L 41/04 | (2006.01) | |
| H01L 41/047 | (2006.01) | |
| H01L 41/083 | (2006.01) | |
| H01L 41/113 | (2006.01) | |
| H01L 41/27 | (2013.01) | |
| G06F 3/041 | (2006.01) | |
| G06V 40/13 | (2022.01) | |
| G06V 40/12 | (2022.01) | |

(52) U.S. Cl.
CPC ...... *G06F 3/04164* (2019.05); *G06V 40/1306* (2022.01); *G06V 40/1365* (2022.01); *H01L 41/042* (2013.01); *H01L 41/0477* (2013.01); *H01L 41/083* (2013.01); *H01L 41/1132* (2013.01); *H01L 41/27* (2013.01); *G06F 2203/04103* (2013.01)

(58) Field of Classification Search
CPC ............ G06V 40/1365; G06V 40/1306; H01L 41/042; H01L 41/0477; H01L 41/083; H01L 41/1132; H01L 41/27
See application file for complete search history.

(56) References Cited

U.S. PATENT DOCUMENTS

| | | |
|---|---|---|
| 2013/0249860 A1 | 9/2013 | Seo et al. |
| 2016/0042217 A1 | 2/2016 | Kim et al. |
| 2016/0124560 A1 | 5/2016 | Watazu et al. |
| 2016/0163958 A1* | 6/2016 | Park ................. H01L 41/047 310/365 |
| 2017/0061839 A1 | 3/2017 | Park et al. |
| 2017/0330012 A1 | 11/2017 | Salvia et al. |
| 2019/0102045 A1* | 4/2019 | Miranto ................. G01S 7/5202 |
| 2020/0356744 A1 | 11/2020 | Wang |

FOREIGN PATENT DOCUMENTS

| | | |
|---|---|---|
| CN | 105335694 A | 2/2016 |
| CN | 106782085 A | 5/2017 |
| CN | 106896955 A | 6/2017 |
| CN | 107122080 A | 9/2017 |
| CN | 107220630 A | 9/2017 |
| CN | 107609539 A | 1/2018 |
| CN | 107798300 A | 3/2018 |
| CN | 207182329 U | 4/2018 |
| CN | 108363993 A | 8/2018 |
| CN | 108446685 A | 8/2018 |
| CN | 108598117 A | 9/2018 |
| CN | 108664913 A | 10/2018 |
| CN | 108776797 A | 11/2018 |
| CN | 108877516 A | 11/2018 |
| CN | 108921074 A | 11/2018 |
| CN | 208126414 U | 11/2018 |
| CN | 109145859 A | 1/2019 |
| CN | 109219817 A | 1/2019 |
| CN | 109584770 A | 4/2019 |
| CN | 109829419 A | 5/2019 |
| EP | 3637304 A1 | 4/2020 |

* cited by examiner

Apply a driving voltage to a driving electrode to drive a portion of the piezoelectric material layer corresponding to the driving electrode to emit an ultrasonic wave — S10010

Receive the ultrasonic wave reflected by a fingerprint using the piezoelectric material layer and output a corresponding fingerprint electrical signal by a receiving electrode — S10020

FINGERPRINT RECOGNITION MODULE, DRIVING METHOD THEREOF, MANUFACTURING METHOD THEREOF AND DISPLAY DEVICE

CROSS-REFERENCE TO RELATED APPLICATIONS

The present application is a U.S. National Stage Application under 35 U.S.C. § 371 of International Patent Application No. PCT/CN2019/105749, filed on Sep. 12, 2019, which claims priority to China Patent Application No. 201910082585.9 filed on Jan. 28, 2019, the disclosure of both of which are incorporated by reference herein in entirety.

TECHNICAL FIELD

The present disclosure relates to a fingerprint recognition module, a driving method thereof, a manufacturing method thereof, and a display device.

BACKGROUND

With the continuous development of science and technology, fingerprint recognition technology has gradually been applied to people's daily life. Fingerprint recognition technology may perform authentication by comparing detailed characteristic points of different fingerprints to achieve the function of identity recognition. Generally, fingerprint recognition technology may comprise optical fingerprint recognition technology, silicon chip fingerprint recognition technology and ultrasonic fingerprint recognition technology.

At present, ultrasonic fingerprint recognition technology has been research trend of various major manufacturers. In related art, the ultrasonic fingerprint recognition module is located in the non-display area, which is mainly because there is much loss in the ultrasonic wave due to reflection and attenuation during the process of penetrating the entire display stack structure, so that there is a small ultrasonic intensity when the ultrasonic wave reach a fingerprint interface, thereby resulting a low recognition of fingerprint valleys and ridges.

SUMMARY

According to an aspect of the embodiments of the present disclosure, a fingerprint recognition module is provided. The fingerprint recognition module comprises: a receiving electrode layer comprising a plurality of receiving electrodes arranged in an array along a first direction and a second direction intersecting with the first direction; a piezoelectric material layer disposed on a side of the receiving electrode layer; and a driving electrode layer disposed on a side of the piezoelectric material layer remote from the receiving electrode layer and comprising a plurality of driving electrodes arranged along the second direction, wherein each of the plurality of driving electrodes is a strip electrode extending along the first direction, and an orthographic projection of the each of the plurality of driving electrodes on the piezoelectric material layer at least partially overlaps with an orthographic projection of multiple receiving electrodes arranged along the first direction on the piezoelectric material layer.

In some embodiments, the plurality of receiving electrodes comprise a plurality of receiving electrode groups arranged along the second direction intersecting with the first direction, wherein each of the plurality of receiving electrode groups comprises at least two receiving electrodes arranged along the first direction; and the orthographic projection of the each of the plurality of driving electrodes on the piezoelectric material layer at least partially overlaps with an orthographic projection of least two of the plurality of receiving electrode groups on the piezoelectric material layer.

In some embodiments, a minimum arrangement period of the plurality of driving electrodes arranged along the second direction is substantially equal to half a wavelength of an ultrasonic wave emitted from the fingerprint recognition module during operation.

In some embodiments, a minimum arrangement period of the plurality of driving electrodes arranged along the second direction is one of a plurality of distance values that are integer multiples of a minimum arrangement period of the plurality of receiving electrodes arranged along the second direction, which is a distance value closest to half the wavelength of the ultrasonic wave emitted from the fingerprint recognition module during operation; wherein there is a gap between adjacent receiving electrodes, and a range of a ratio R of a width of the gap along the second direction to a minimum arrangement period of the plurality of receiving electrodes arranged along the second direction is: $0 < R \leq 20\%$.

In some embodiments, a width of each of the plurality of driving electrodes along the second direction is less than or equal to half the wavelength of the ultrasonic wave emitted from the fingerprint recognition module during operation.

In some embodiments, the driving electrode layer further comprises a barrier wall located between two adjacent driving electrodes.

In some embodiments, a size of each of the plurality of driving electrodes in a direction perpendicular to the driving electrode layer ranges from 1 micron to 20 microns, and a size of the barrier wall in the direction perpendicular to the driving electrode layer is greater than or equal to the size of each of the plurality of driving electrodes in the direction perpendicular to the driving electrode layer.

In some embodiments, the piezoelectric material layer comprises a plurality of sub-piezoelectric material layers arranged along the second direction, wherein the plurality of sub-piezoelectric material layers are disposed in one-to-one correspondence with the plurality of driving electrodes.

In some embodiments, the fingerprint recognition module further comprises: a reflective layer located on a side of the driving electrode layer remote from the piezoelectric material layer; and an insulating layer located between the reflective layer and the driving electrode layer.

In some embodiments, each of the plurality of driving electrodes comprises a first sub-driving electrode in contact with the piezoelectric material layer and a second sub-driving electrode on a side of the first sub-driving electrode remote from the piezoelectric material layer, wherein a thickness of the first sub-driving electrode is less than a thickness of the second sub-driving electrode.

In some embodiments, the fingerprint recognition module further comprises: a plurality of driving circuits electrically connected to the plurality of receiving electrodes in a one-to-one correspondence, wherein each of the plurality of driving circuits comprises: a storage capacitor comprising a first electrode and a second electrode; a first thin film transistor comprising a first gate, a first source, and a first drain; and a signal reading sub-circuit, configured to read a fingerprint electrical signal stored in the storage capacitor, wherein for each driving circuit, a receiving electrode electrically connected to the each driving circuit is electrically connected to the first source and the first electrode.

In some embodiments, the first thin film transistor is an oxide thin film transistor.

In some embodiments, the signal reading sub-circuit comprises: a second thin film transistor comprising a second gate, a second source, and a second drain; and a third thin film transistor, comprising a third gate, a third source, and a third drain, wherein the second gate is electrically connected to the first electrode of the storage capacitor, the second drain is electrically connected to the third source, the second source is configured to receive a fixed voltage, and the third gate is configured to receive a read instruction signal, and the third drain is configured to output an electric signal corresponding to the fingerprint electrical signal.

In some embodiments, the fingerprint recognition module further comprises: a plurality of multiplexers, each of which is configured to select and output the electrical signal corresponding to the fingerprint electrical signal; a plurality of groups of data signal lines, each of which comprises multiple data signal lines, wherein the plurality of groups of data signal lines are electrically connected to the plurality of multiplexers in one-to-one correspondence, and each of the multiple data signal lines is electrically connected to third drains of third thin film transistors of a plurality of driving circuits arranged along the first direction; a control circuit electrically connected to the plurality of multiplexers and configured to control the plurality of multiplexers to select and output the electrical signal corresponding to the fingerprint electrical signal; a plurality of gate lines, each of which is electrically connected to third gates of third thin film transistors of a plurality of driving circuits arranged along the second direction; and a gate driving circuit electrically connected to the plurality of gate lines and configured to provide the read instruction signal.

In some embodiments, the fingerprint recognition module further comprises: a plurality of gate driving circuits, each of which is configured to provide the read instruction signal; a plurality of groups of gate lines, each of which comprises a plurality of gate lines, wherein the plurality of groups of gate lines are electrically connected to the plurality of gate driving circuits in one-to-one correspondence, and each of the plurality of gate lines is electrically connected to third gates of third thin film transistors of a plurality of driving circuits arranged along the first direction; and a plurality of data signal lines, each of which is electrically connected to third drains of third thin film transistors of a plurality of driving circuits arranged along the second direction.

According to another aspect of the embodiments of the present disclosure, a display device is provided. The display device comprises: the fingerprint recognition module as described above.

In some embodiments, the display device further comprises a display module, wherein an area of the display module is substantially equal to that of the fingerprint recognition module.

According to another aspect of the embodiments of the present disclosure, a driving method for the fingerprint recognition module is provided. The driving method comprises: applying a driving voltage to a driving electrode so as to drive a portion of the piezoelectric material layer corresponding to the driving electrode to emit an ultrasonic wave; and receiving the ultrasonic wave reflected by a fingerprint using the piezoelectric material layer and outputting a corresponding fingerprint electrical signal by a receiving electrode.

In some embodiments, the plurality of driving electrodes comprise a first driving electrode and a second driving electrode, and the driving method comprises: applying the driving voltage to the first driving electrode at a first time point so as to drive a portion of the piezoelectric material layer corresponding to the first driving electrode to emit an ultrasonic wave; and applying the driving voltage to the second driving electrode at a second time point after the first time point so as to drive a portion of the piezoelectric material layer corresponding to the second driving electrode to emit an ultrasonic wave, a phase of which is delayed from a phase of the ultrasonic wave emitted from the portion of the piezoelectric material layer corresponding to the first driving electrode.

In some embodiments, the plurality of driving electrodes comprise a first driving electrode, a second driving electrode, and a third driving electrode, the second driving electrode is located between the first driving electrode and the third driving electrode, and the driving method comprises: applying the driving voltage to the first driving electrode and the third driving electrode at the first time point so as to drive a portion of the piezoelectric material layer corresponding to the first driving electrode and the third driving electrode to emit an ultrasonic wave; and applying the driving voltage to the second driving electrode at the second time point so as to drive a portion of the piezoelectric material layer corresponding to the second driving electrode to emit an ultrasonic wave, a phase of which is delayed from a phase of the ultrasonic wave emitted from the portion of the piezoelectric material layer corresponding to the first driving electrode and the third driving electrode.

In some embodiments, the receiving the ultrasonic wave reflected by the fingerprint using the piezoelectric material layer and outputting the corresponding fingerprint electrical signal through the receiving electrode comprises: turning on the receiving electrode corresponding to the second driving electrode according to reflected echo time of the second driving electrode so as to receive reflected echo.

In some embodiments, the fingerprint recognition module further comprises: a plurality of driving circuits electrically connected to the plurality of receiving electrodes in a one-to-one correspondence, and each of the plurality of driving circuits comprises: a storage capacitor comprising a first electrode and a second electrode; a first thin film transistor comprising a first gate, a first source, and a first drain; and a signal reading sub-circuit, wherein for each driving circuit, a receiving electrode electrically connected to the each driving circuit is electrically connected to the first source and the first electrode, and wherein the receiving the ultrasonic wave reflected by the fingerprint using the piezoelectric material layer and outputting the corresponding fingerprint electrical signal through the receiving electrode comprises: applying a turn-on signal to the first gate to turn on the first thin film transistor when the driving voltage is applied to the driving electrode so as to drive the portion of the piezoelectric material layer corresponding to the driving electrode to emit the ultrasonic wave; applying a bias voltage to the first drain according to an arrival time of the ultrasonic wave being reflected back to the piezoelectric material layer so as to raise the fingerprint electrical signal on the receiving electrode, and store a raised fingerprint electrical signal in the storage capacitor; and reading out the raised fingerprint electrical signal using the signal reading sub-circuit.

In some embodiments, the driving voltage is applied to 8 to 10 driving electrodes during the applying the driving voltage to the driving electrode.

According to another aspect of the embodiments of the present disclosure, a manufacturing method for a fingerprint recognition module is provided. The manufacturing method comprises: providing a substrate; forming a receiving electrode layer on a side of the substrate, wherein the receiving electrode layer comprises a plurality of receiving electrodes arranged in an array along a first direction and a second direction intersecting with the first direction; forming a piezoelectric material layer on a side of the receiving electrode layer remote from the substrate; and forming a driving electrode layer on a side of the piezoelectric material layer remote from the receiving electrode layer, wherein the driving electrode layer comprises a plurality of driving electrodes arranged along the second direction, wherein each of the plurality of driving electrodes is a strip electrode extending along the first direction, and an orthographic projection of the each of the plurality of driving electrodes on the piezoelectric material layer at least partially overlaps with an orthographic projection of multiple receiving electrodes arranged along the first direction on the piezoelectric material layer.

In some embodiments, the forming the driving electrode layer on the side of the piezoelectric material layer remote from the receiving electrode layer comprises: forming a plurality of first sub-driving electrodes by a patterning process, wherein each of the plurality of first sub-driving electrodes is a strip sub-electrode extending along the first direction; forming a barrier wall between adjacent first sub-driving electrodes; and forming a plurality of second sub-driving electrodes in one-to-one correspondence with the plurality of first sub-driving electrodes on a side of the plurality of first sub-driving electrodes remote from the substrate by an electroplating process, wherein a height of the barrier wall in a direction perpendicular to the driving electrode layer is greater than that of each of the plurality of first sub-driving electrodes in the direction perpendicular to the driving electrode layer, and the plurality of first sub-driving electrodes and the plurality of second sub-driving electrodes constitute the plurality of driving electrodes.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
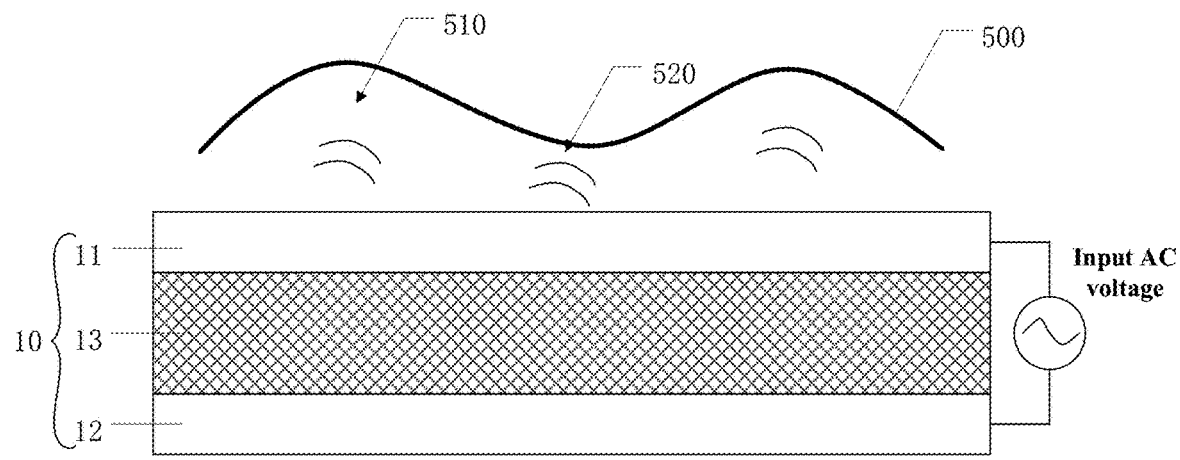
FIG. 1 is a schematic view showing that a fingerprint recognition module emits an ultrasonic wave according to an embodiment.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The ultrasonic fingerprint recognition structure is mainly a triple-stack structure, which comprises a driving electrode, a receiving electrode, and a piezoelectric layer located therebetween. When a driving voltage is applied to the driving electrode and the receiving electrode, the piezoelectric layer is excited by the voltage to generate an inverse piezoelectric effect and emits a first ultrasonic wave outward. After the first ultrasonic wave contacts the finger, a second ultrasonic wave is reflected back by the finger. Since the fingerprint comprises valleys and ridges, there are different vibration intensities of the second ultrasonic wave reflected by the fingerprint back to the piezoelectric layer. At this time, when a fixed voltage is applied to the driving electrode, the piezoelectric layer may convert the second ultrasonic wave into a voltage signal which is transmitted to the signal processing module through the receiving electrode. The signal processing module determines the positions of valleys and ridges in the fingerprint according to the voltage signal.

Figure 2:
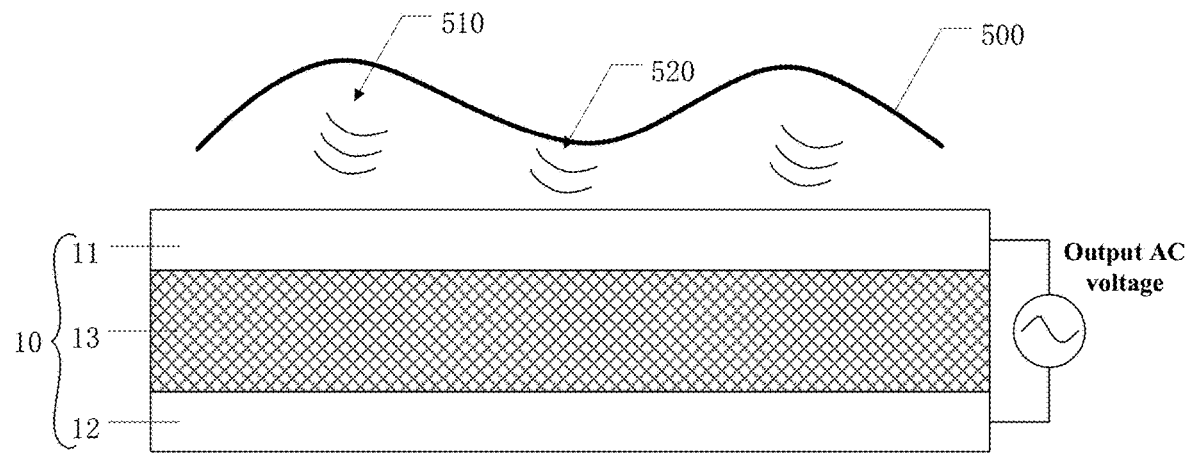
FIG. 2 is a schematic view showing that a fingerprint recognition module receives an ultrasonic wave according to an embodiment.

FIG. 1 is a schematic view showing that a fingerprint recognition module emits an ultrasonic wave according to an embodiment. FIG. 2 is a schematic view showing that a fingerprint recognition module receives an ultrasonic wave according to an embodiment.

As shown in FIG. 1, the fingerprint recognition module comprises an ultrasonic sensor 10. The ultrasonic sensor 10 comprises an upper electrode 11, a lower electrode 12, and a piezoelectric layer 13 located between the upper electrode 11 and the lower electrode 12. The piezoelectric layer 13 is made of a piezoelectric material and may be excited by a voltage to generate the inverse piezoelectric effect. As shown in FIG. 1, when an alternating voltage (AC voltage) is input to the upper electrode 11 and the lower electrode 12 (e.g., the upper electrode 11 is grounded, and the lower electrode 12 receives an AC square wave), the piezoelectric layer 13 may be deformed or drive the film layers above and below the piezoelectric layer 13 to vibrate together due to the inverse piezoelectric effect, so that an ultrasonic wave may be generated and emitted outward. It should be noted that when a cavity (e.g., an air cavity) is provided on a side of the upper electrode 11 remote from the piezoelectric layer 13 or a side of the lower electrode 12 remote from the piezoelectric layer 13, the ultrasonic wave emitted from the ultrasonic sensor may be strengthened so that the ultrasonic wave may be better emitted.

As shown in FIG. 2, the ultrasonic wave emitted from the ultrasonic sensor 10 is reflected by the fingerprint 500. A reflected ultrasonic wave is converted into an alternating voltage in the piezoelectric layer. At this time, the upper electrode 11 is grounded, and the lower electrode 12 may be used as a receiving electrode to receive an alternating voltage generated by the piezoelectric layer. The fingerprint 500 comprises valleys 510 and ridges 520, which have different reflection capabilities for an ultrasonic wave. For example, the valleys 510 have a strong reflection capability for an ultrasonic wave. This causes the intensities of the ultrasonic waves reflected by the valleys 510 and the ridges 520 to be different. Therefore, it may be judged whether the ultrasonic wave is an ultrasonic wave reflected by valleys or ridges based on alternating voltages received by the receiving electrode.

Figure 3:
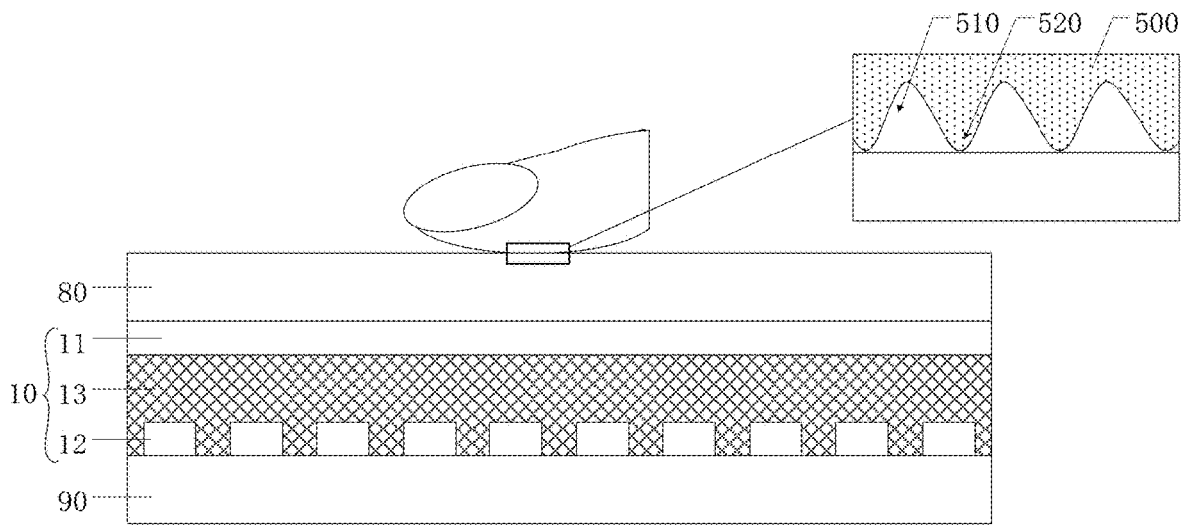
FIG. 3 is a schematic view showing that a fingerprint recognition module performs a fingerprint recognition according to an embodiment.

FIG. 3 is a schematic view showing that a fingerprint recognition module performs fingerprint recognition according to an embodiment. As shown in FIG. 3, the fingerprint recognition module comprises an upper electrode 11, a plurality of lower electrodes 12, a piezoelectric layer 13 located between the upper electrode 11 and the plurality of lower electrodes 12, a substrate 80 located on a side of the upper electrode 11 remote from the piezoelectric layer 13, and a protective layer 90 located on a side of the plurality of lower electrodes 12 remote from the piezoelectric layer 13. The ultrasonic sensor 10 consisting of the plurality of lower electrodes 12, the piezoelectric layer 13, and the upper electrode 11 may emit or receive an ultrasonic wave. That is, the ultrasonic sensor 10 functions as both an ultrasonic emitting sensor and an ultrasonic receiving sensor. When the fingerprint is in contact with the substrate 80, the ultrasonic wave emitted from the ultrasonic sensor 10 is reflected by the fingerprint 500, and a reflected ultrasonic wave may be converted into an alternating voltage in the piezoelectric layer. For example, the reflected ultrasonic wave acts on the piezoelectric layer 13 so that an induction charge may be generated by the piezoelectric layer, thereby generating a voltage. At this time, the upper electrode 11 is grounded, and the plurality of lower electrodes 12 may be used as receiving electrodes, thereby implementing that an alternating voltage generated by the piezoelectric layer is received at different positions. Since the fingerprint 500 comprises valleys 510 and ridges 520 which have different reflection capabilities for an ultrasonic wave (the valleys 510 have stronger reflection ability for an ultrasonic wave), this causes the intensities of the ultrasonic waves reflected by the valleys 510 and the ridges 520 to be different. Therefore, the position information of the valleys and ridges in the fingerprint 500 may be obtained by the alternating voltage received by the plurality of lower electrodes 12, so that fingerprint recognition may be realized.

Figure 4:
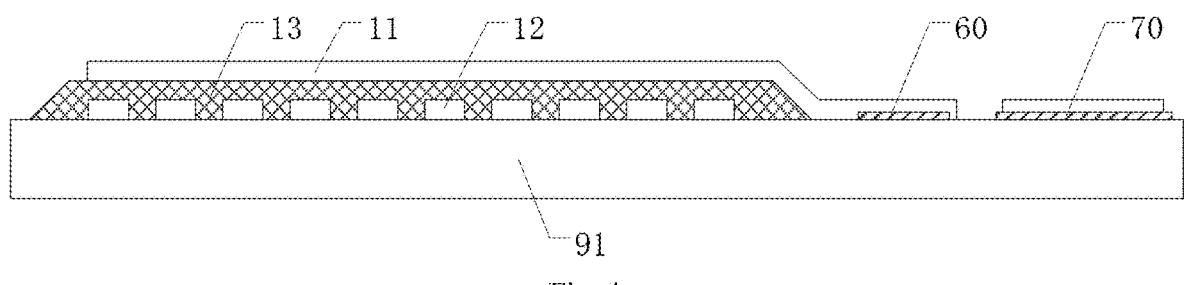
FIG. 4 is a schematic structural view showing a fingerprint recognition module according to an embodiment.

FIG. 4 is a schematic structural view showing a fingerprint recognition module according to an embodiment. As shown in FIG. 4, the upper electrode 11, the lower electrode 12 and the piezoelectric layer 13 may all be manufactured on the same side of the thin film transistor substrate 91. The fingerprint recognition module may further comprise a bias resistor 60 and a bonding pad 70. The bias resistor 60 may be configured to calibrate a voltage. The bonding pad 70 may be configured to bond an external circuit.

In the research, the inventors of the present disclosure have found that during the process of emitting an ultrasonic wave by the above-described fingerprint recognition module, the entire fingerprint recognition module simultaneously performs emission so that there is a poor performance in fingerprint recognition.

The embodiments of the present disclosure provide a fingerprint recognition module, a driving method for the fingerprint recognition module, a manufacturing method for the fingerprint recognition module, and a display device.

In some embodiments, the fingerprint recognition module comprises a receiving electrode layer, a piezoelectric material layer, and a driving electrode layer. The receiving electrode layer comprises a plurality of receiving electrodes. The plurality of receiving electrodes are arranged in an array along a first direction and a second direction. The piezoelectric material layer is disposed on a side of the receiving electrode layer. The driving electrode layer is disposed on a side of the piezoelectric material layer remote from the receiving electrode layer and comprises a plurality of driving electrodes arranged along the second direction. Each of the plurality of driving electrodes is a strip electrode extending along the first direction, and overlaps with multiple receiving electrodes arranged along the first direction.

The driving electrode layer of the fingerprint recognition module comprises a plurality of driving electrodes, so that an ultrasonic wave may be focused (i.e., constructive interference) by respectively driving the plurality of driving electrodes described above. On the one hand, the intensity or energy of the emitted ultrasonic wave in a specific area may be strengthened, thereby improving the fingerprint recognition performance. On the other hand, it is possible to cause the emitted ultrasonic wave to have a better directivity, which may reduce the crosstalk between an ultrasonic wave reflected by the valleys of the fingerprint and an ultrasonic wave reflected by the ridges of the fingerprint, thereby improving the fingerprint recognition performance.

The fingerprint recognition module, the driving method for the fingerprint recognition module, the manufacturing method for the fingerprint recognition module, and the display device according to the embodiments of the present disclosure will be described in detail below in conjunction with the accompanying drawings.

Figure 5A:
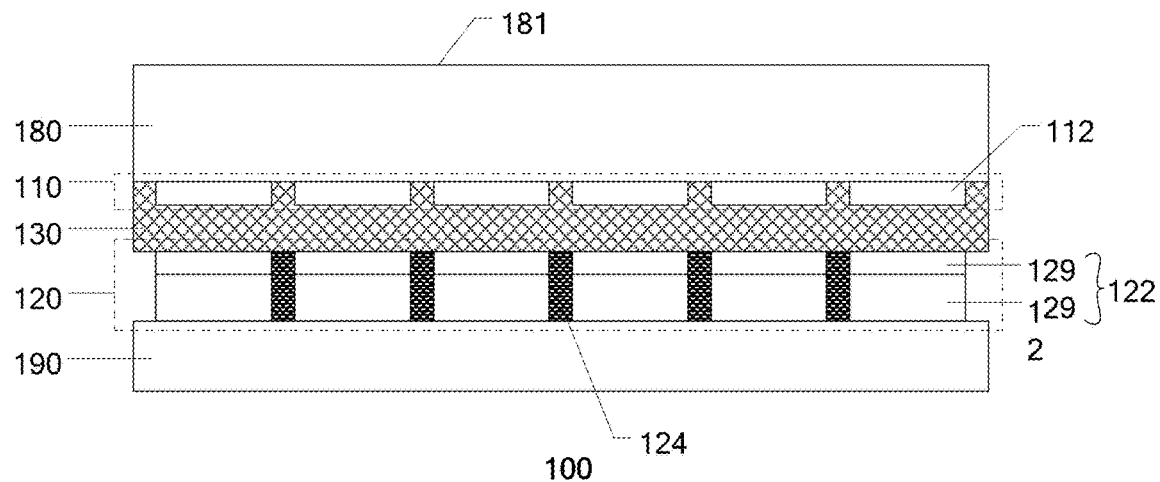
FIG. 5A is a schematic cross-sectional view showing a structure of a fingerprint recognition module according to an embodiment of the present disclosure.
Figure 5B:
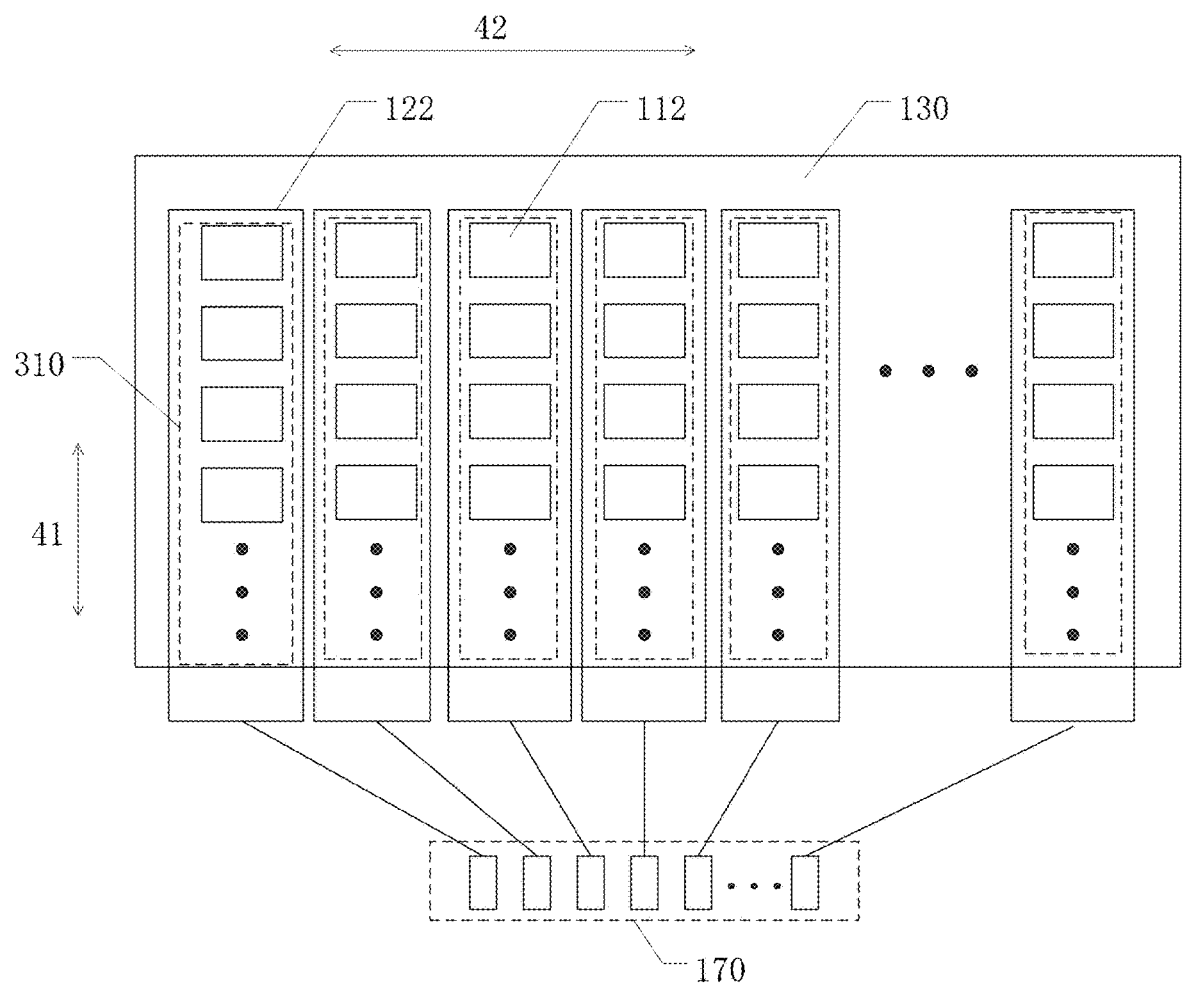
FIG. 5B is a schematic plan view showing a fingerprint recognition module according to an embodiment of the present disclosure.

FIG. 5A is a schematic cross-sectional view showing a structure of a fingerprint recognition module according to an embodiment of the present disclosure. FIG. 5B is a schematic plan view showing a fingerprint recognition module according to an embodiment of the present disclosure.

As shown in FIGS. 5A and 5B, the fingerprint recognition module 100 comprises a receiving electrode layer 110, a driving electrode layer 120, and a piezoelectric material layer 130.

The receiving electrode layer 110 comprises a plurality of receiving electrodes 112. The plurality of receiving electrodes 112 are arranged in an array along a first direction 41 and a second direction 42. The second direction intersects with the first direction. The piezoelectric material layer 130 is disposed on a side of the receiving electrode layer. The driving electrode layer 120 is disposed on a side of the piezoelectric material layer 130 remote from the receiving electrode layer 110. The driving electrode layer 120 comprises a plurality of driving electrodes 122 arranged along the second direction 42. Each driving electrode 122 is a strip electrode extending along the first direction 41 and overlaps with multiple receiving electrodes 112 arranged along the first direction 41. It should be noted that the above-described "overlap" means that an orthographic projection of each driving electrode on the piezoelectric material layer at least partially overlaps with an orthographic projection of the multiple receiving electrodes arranged along the first direction on the piezoelectric material layer. For example, as shown in FIG. 5B, the first direction 41 is a column direction, and the second direction 42 is a row direction. For another example, the first direction 41 is a row direction, and the second direction 42 is a column direction.

In some embodiments, as shown in FIG. 5B, the plurality of receiving electrodes 112 comprise a plurality of receiving electrode groups 310 arranged along the second direction. Each receiving electrode group 310 comprises at least two receiving electrodes 122 arranged along the first direction 41. For example, the plurality of driving electrodes 122 overlap with the plurality of receiving electrode groups 310 in one-to-one correspondence. For example, in a case where the driving electrodes extend along a longitudinal direction, each receiving electrode group comprises one column of receiving electrodes. For another example, in a case where the driving electrodes extend along a transverse direction, each receiving electrode group comprises one row of receiving electrodes.

In the fingerprint recognition module provided in the present embodiment, the driving electrode 122, the piezoelectric material layer 130 corresponding to the driving electrode 122, and multiple receiving electrodes 112 arranged along the first direction which overlap with the driving electrode 122 may constitute an ultrasonic emitting element. The receiving electrode 112, the piezoelectric material layer 130 corresponding to the receiving electrode 112, and the driving electrode 122 overlapping with the receiving electrode 112 may constitute an ultrasonic receiving element.

When the fingerprint recognition module performs fingerprint recognition, the receiving electrode 112 may be grounded, and then an alternating voltage may be applied to the plurality of driving electrodes 122 arranged along the second direction. The piezoelectric material layer 130 corresponding to the driving electrode 122 is deformed or drives the film layers above and below the piezoelectric material layer 130 to vibrate together due to an inverse piezoelectric effect, so that an ultrasonic wave may be generated and emitted outward. Since the driving electrode layer of the fingerprint recognition module comprises a plurality of driving electrodes, a plurality of ultrasonic emitting elements described above may be formed, so that the ultrasonic wave is focused by respectively driving the plurality of driving electrodes described above. In this way, on the one hand, the intensity or energy of the emitted ultrasonic wave in a specific area or a specific direction may be improved, thereby improving the fingerprint recognition performance; on the other hand, it is possible to cause the emitted ultrasonic wave to have a better directivity, which may reduce the crosstalk between an ultrasonic wave reflected by the valleys of the fingerprint and an ultrasonic wave reflected by the ridges of the fingerprint, thereby improving the fingerprint recognition performance.

When the emitted ultrasonic wave is reflected back to the fingerprint recognition module by the fingerprint, the plurality of ultrasonic receiving elements corresponding to the plurality of receiving electrodes 112 may receive the reflected ultrasonic wave and convert the ultrasonic signal into an electrical signal (which may be referred to as a fingerprint electrical signal) to realize fingerprint recognition.

In other embodiments, when the fingerprint recognition module improves the intensity or energy of the emitted ultrasonic wave in the specific area or the specific direction by focusing the ultrasonic wave, the fingerprint recognition module may not only realize fingerprint recognition, but also penetrate a finger to discriminate whether the fingerprint is a fingerprint on real skin.

In some embodiments, optionally, as shown in FIG. 5A, the driving electrode layer 120 may further comprise a barrier wall 124. The barrier wall 124 is located between two adjacent driving electrodes 122. For example, a material of the barrier wall 124 may comprise an insulating material. For example, the barrier wall 124 may be made of a resin material, so that it is possible to have lower cost and lower manufacturing difficulty.

In order to cause the fingerprint recognition module 100 to have a high receiving sensitivity to an ultrasonic wave, the piezoelectric material layer 130 is generally made of a piezoelectric material having a high piezoelectric voltage constant such as PVDF (polyvinylidene fluoride). However, the piezoelectric material having the high piezoelectric voltage constant, such as PVDF (polyvinylidene fluoride), requires a high driving voltage to generate an ultrasonic wave having a high intensity. Therefore, the driving electrode 122 needs to be made thicker, for example, greater than 10 micrometers, so as to be adapted to load a high voltage.

By the above-described barrier wall 124, a patterned metal layer may be first formed on a side of the piezoelectric material layer 130 remote from the receiving electrode layer 110, and the metal layer need not be made thicker. Then, a metal layer is electroplated on the patterned metal layer to obtain a thick driving electrode. It should be noted that in the electroplating process, under the effect of an electric field, the metal layer can continue to grow only on the patterned metal layer, and the barrier wall may produce a separating effect to prevent the electroplated metal layers from being connected to each other.

In other embodiments, the driving electrode layer does not comprise the above-described barrier wall. For example, each driving electrode may be spaced apart by a gap, which also prevents a short circuit between different driving electrodes.

In some embodiments, as shown in FIG. 5A, each driving electrode 122 may comprise a first sub-driving electrode 1291. The first sub-driving electrode 1291 is in contact with the piezoelectric material layer 130. Each first sub-driving electrode 1291 is also a strip sub-electrode extending along the first direction. Each driving electrode 122 further comprises a second sub-driving electrode 1292 on a side of the first sub-driving electrode 1291 remote from the piezoelectric material layer 130. A plurality of first sub-driving electrodes 1291 are arranged in one-to-one correspondence to a plurality of second sub-driving electrodes 1292. A thickness of the first sub-driving electrode 1291 (i.e., a size of the first sub-driving electrode 1291 in a direction perpendicular to the driving electrode layer 120) is less than a thickness of the second sub-driving electrode 1292 (i.e., a size of the second sub-driving electrode 1292 in the direction perpendicular to the driving electrode layer 120). The first sub-driving electrode 1291 may be a metal layer formed using a patterning process, and the second sub-driving electrode 1292 may be a metal layer formed using an electroplating process. A height of the barrier wall 124 in the direction perpendicular to the driving electrode layer 120 is greater than that of the first sub-driving electrode 1291 in the direction perpendicular to the driving electrode layer 120. The plurality of first sub-driving electrodes 1291 and the plurality of second sub-driving electrodes 1292 constitute a plurality of driving electrodes 122.

In other embodiments, each driving electrode may be an overall driving electrode without comprising such a double-layer structure as the first sub-driving electrode and the second sub-driving electrode.

In some embodiments, the size of the barrier wall 124 in the direction perpendicular to the driving electrode layer 120 ranges from 1 micron to 20 microns. In some embodiments, the size of the driving electrode 122 in the direction perpendicular to the driving electrode layer 120 ranges from 1 micron to 20 microns. The size of the barrier wall 124 in the direction perpendicular to the driving electrode layer 120 is greater than or equal to the size of the driving electrode 122 in the direction perpendicular to the driving electrode layer 120. In this way, it is possible to prevent connection of different driving electrodes. Since the driving electrode 122 has a great thickness, the driving electrode 122 has a small resistance and a better surface uniformity, so that it is possible to achieve a better electrical performance (e.g., loading a high driving voltage), and also uniformly reflect an ultrasonic wave, which is favorable for recognition of the valleys and ridges of the fingerprint.

In some embodiments, a material of the driving electrode may comprise one or more of copper, silver, or aluminum.

In some embodiments, as shown in FIG. 5A, the fingerprint recognition module 100 may further comprise a substrate 180. The substrate 180 is located on a side of the receiving electrode layer 110 remote from the piezoelectric material layer 130. The substrate 180 comprises a contact surface 181 configured to be in contact with a fingerprint. When the fingerprint is in contact with the contact surface 181, the fingerprint recognition module 100 may recognize the fingerprint by emitting an ultrasonic wave to the fingerprint and receiving an ultrasonic wave (echo) reflected by the fingerprint 500. Certainly, the embodiments of the present disclosure comprise but are not limited thereto. When the fingerprint recognition module 100 is used for a display device, the substrate 180 may be a cover plate of the display device.

For example, the substrate 180 may comprise a glass substrate.

For another example, the substrate 180 may comprise a polyimide substrate. Therefore, the substrate 180 may be made thin, and a thickness of the substrate 180 ranges from 1 micron to 20 microns. It should be noted that when the substrate 180 is the polyimide substrate, a polyimide layer may be first formed on a glass substrate, and then layer structures such as the receiving electrode layer, the piezoelectric material layer, and the driving electrode layer may be formed on the polyimide layer, and finally the glass substrate is removed so as to obtain the fingerprint recognition module described in the example.

In some embodiments, optionally, as shown in FIG. 5A, the fingerprint recognition module 100 may further comprise a protective layer 190. The protective layer 190 is located on a side of the driving electrode layer 120 remote from the piezoelectric material layer 130. The protective layer 190 may protect the driving electrodes 122 in the driving electrode layer 120. For example, a material of the protective layer 190 may be an epoxy resin.

In some embodiments, as shown in FIG. 5B, the fingerprint recognition module 100 may further comprise a bonding pad 170. The bonding pad 170 is configured to bond an external circuit.

Figure 6A:
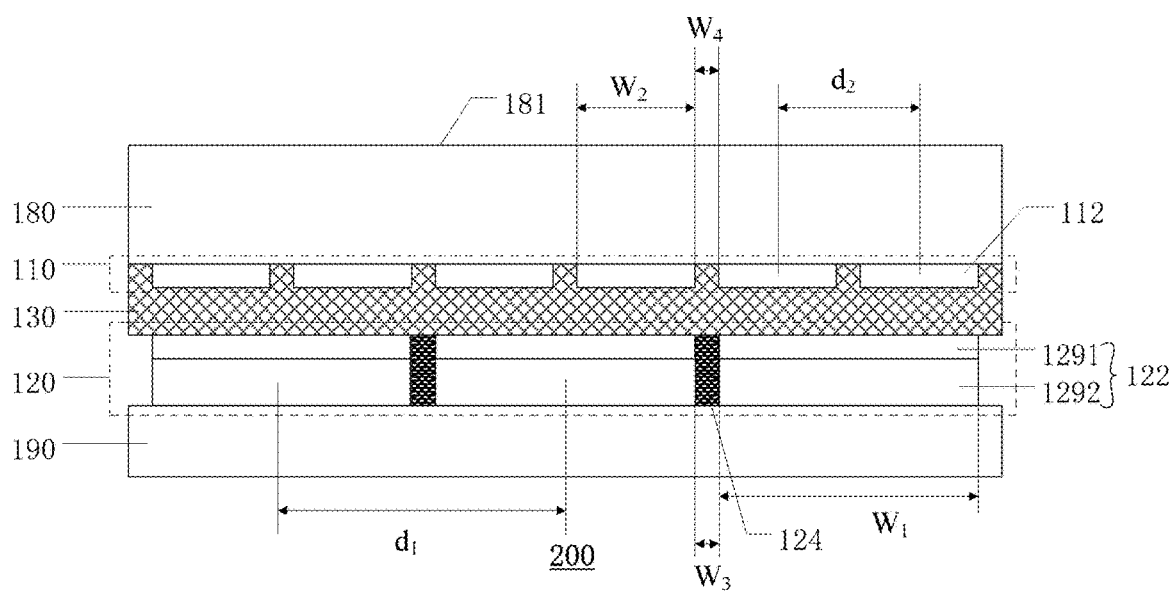
FIG. 6A is a schematic cross-sectional view showing a structure of a fingerprint recognition module according to another embodiment of the present disclosure.
Figure 6B:
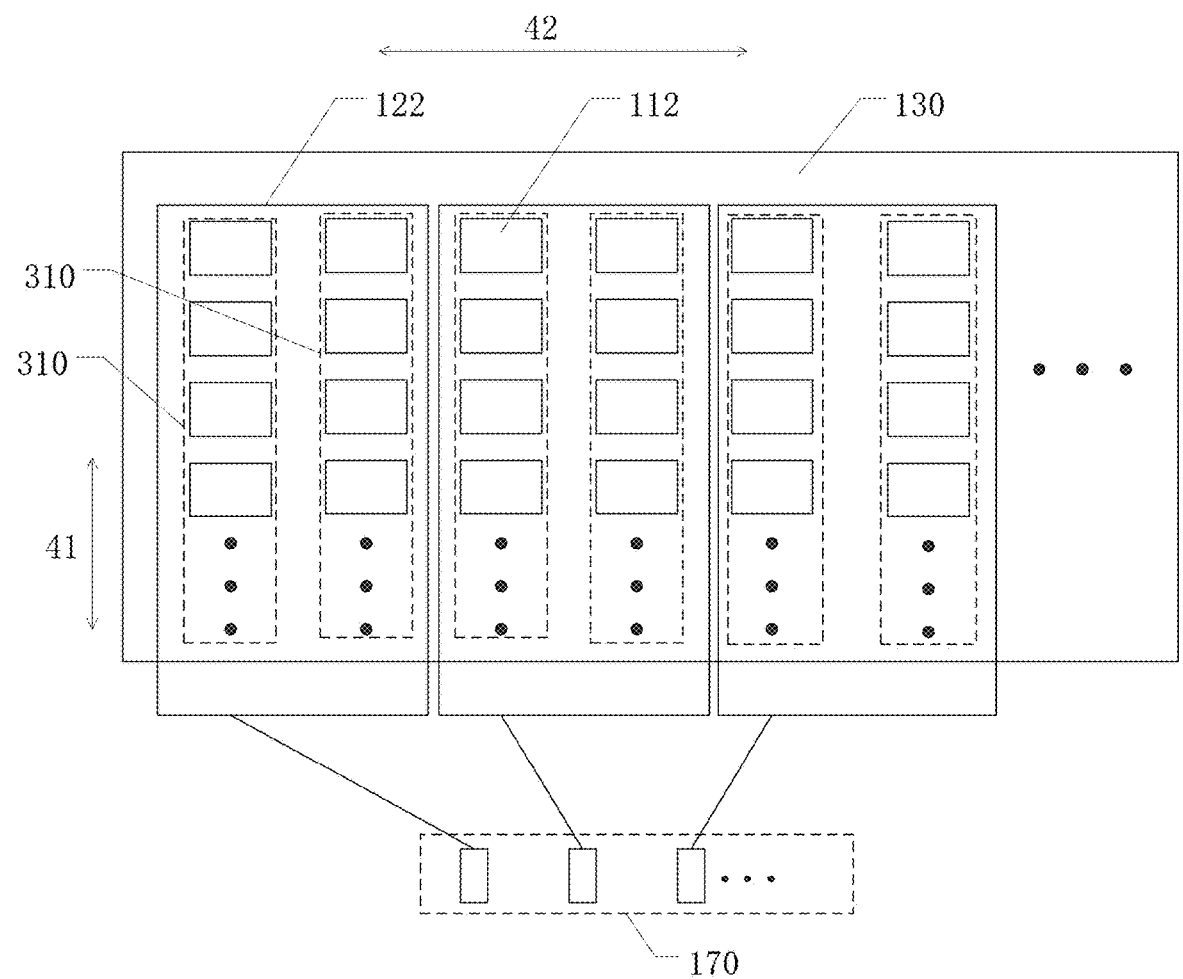
FIG. 6B is a schematic plan view showing a fingerprint recognition module according to another embodiment of the present disclosure.

FIG. 6A is a schematic cross-sectional view showing a structure of a fingerprint recognition module according to another embodiment of the present disclosure. FIG. 6B is a schematic plan view showing a fingerprint recognition module according to another embodiment of the present disclosure.

As shown in FIGS. 6A and 6B, the fingerprint recognition module 200 comprises a receiving electrode layer 110, a driving electrode layer 120, and a piezoelectric material layer 130. The fingerprint recognition module shown in FIG. 6A and FIG. 6B may further comprise a structure that is the same as or similar to the fingerprint recognition module shown in FIGS. 5A and 5B, which will not be described in detail here.

The receiving electrode layer 110 comprises a plurality of receiving electrodes 112. The plurality of receiving electrodes 112 are arranged in an array along a first direction 41 and a second direction 42. The piezoelectric material layer 130 is disposed on a side of the receiving electrode layer. The driving electrode layer 120 is disposed on a side of the piezoelectric material layer 130 remote from the receiving electrode layer 110. The driving electrode layer 120 comprises a plurality of driving electrodes 122 arranged along the second direction 42. Each driving electrode 122 is a strip electrode extending along the first direction 41 and overlaps with multiple receiving electrodes 112 arranged along the first direction 41. For example, as shown in FIG. 6B, the first direction 41 is a column direction, and the second direction 42 is a row direction. For another example, the first direction 41 is a row direction, and the second direction 42 is a column direction.

In some embodiments, as shown in FIG. 6B, the plurality of receiving electrodes 112 comprise a plurality of receiving electrode groups 310 arranged along the second direction 42. Each receiving electrode group 310 comprises at least two receiving electrodes 112 arranged along the first direction 41. For example, each driving electrode 122 overlaps with at least two receiving electrode groups 310. That is, the orthographic projection of the each of the plurality of driving electrodes on the piezoelectric material layer at least partially overlaps with an orthographic projection of least two of the plurality of receiving electrode groups on the piezoelectric material layer. For example, in a case where the driving electrodes extend along a longitudinal direction, each receiving electrode group comprises one column of receiving electrodes. For another example, in a case where the driving electrodes extend along a transverse direction, each receiving electrode group comprises one row of receiving electrodes.

It should be noted that FIGS. 6A and 6B show that each driving electrode corresponds to two receiving electrode groups, but the scope of the embodiments of the present disclosure is not limited thereto. For example, each driving electrode may correspond to three or more receiving electrode groups.

In the above-described embodiments, the above-described fingerprint recognition module may also focus an ultrasonic wave, and improve the fingerprint recognition performance. In addition, by providing each driving electrode corresponding to multiple receiving electrode groups, the size of the driving electrode may be guaranteed to be as large as possible, so that it is possible to produce the effect of reducing the side lobe and enhancing the main beam.

In some embodiments, a minimum arrangement period of the plurality of driving electrodes 122 arranged along the second direction 42 is substantially equal to half a wavelength of an ultrasonic wave emitted from the fingerprint recognition module during operation. Here, the minimum arrangement period of the plurality of driving electrodes 122 arranged along the second direction may be a distance $d_1$ between adjacent driving electrodes 122. Here, the distance between the adjacent driving electrodes refers to a distance between centers of the adjacent driving electrodes. The distance $d_1$ is a sum of a width $W_1$ of the driving electrode 122 along the second direction 42 and a width $W_3$ of a gap (which may be referred to as a first gap) between two adjacent driving electrodes along the second direction. For example, as shown in FIG. 6A, the distance $d_1$ between the adjacent driving electrodes 122 is substantially equal to half a wavelength of the ultrasonic wave emitted from the fingerprint recognition module during operation. In the embodiment, the distance between the adjacent driving electrodes is designed to be substantially equal to half a wavelength of the ultrasonic wave, which may enhance the main beam and suppress the side lobe effect. This may improve the directivity of the main beam, thereby favorably focusing a sound beam.

It should be noted that the "essentially equal" described above comprises, but is not limited to, "absolutely equal", but there may be a certain error, which may be determined according to actual conditions or actual needs.

In some embodiments, a minimum arrangement period of the plurality of driving electrodes 122 arranged along the second direction is one of a plurality of distance values that are integer multiples of a minimum arrangement period of the plurality of driving electrodes 112 along the second direction, which is a distance value closest to half the wavelength of the ultrasonic wave emitted from the fingerprint recognition module during operation. Here, the minimum arrangement period of the plurality of receiving electrodes 112 arranged along the second direction may be a distance $d_2$ between adjacent receiving electrodes 112. Here, the distance between the adjacent receiving electrodes refers to a distance between centers of the adjacent receiving electrodes. The distance $d_2$ is a sum of a width $W_2$ of the receiving electrode 112 along the second direction 42 and a width $W_4$ of a gap (which may be referred to as a second gap) between two adjacent receiving electrodes along the second direction. There are a plurality of distance values for integer multiples of the minimum arrangement period of the plurality of driving electrodes 112 along the second direction. The distance which is closest to half a wavelength of an ultrasonic wave emitted from the fingerprint recognition module during operation, is selected from the plurality of distance values as the minimum arrangement period of the plurality of driving electrodes 122 arranged along the second direction.

For example, the minimum arrangement period of the plurality of receiving electrodes 112 along the second direction is 80 microns, half a wavelength of the ultrasonic wave is 300 microns, and 320 microns is the closest value to 300 microns among integer multiples of 80 microns. Thus, the 320 microns may serve as the minimum arrangement period of the driving electrodes 122, that is, the distance between the adjacent driving electrodes.

In some embodiments, there is a gap (i.e., the second gap) between adjacent receiving electrodes 112. A range of a ratio R of the width $W_4$ of the gap along the second direction to the minimum arrangement period of the plurality of receiving electrodes 122 arranged along the second direction is: $0<R\leq20\%$. For example, the width of the gap between the adjacent receiving electrodes may range from 5 microns to 10 microns. For example, the distance $d_2$ between the adjacent receiving electrodes 112 may range from 50 microns to 100 microns.

In some embodiments, there is a gap (i.e., the first gap) between adjacent driving electrodes 122. For example, the width $W_3$ of the gap along the second direction may range from 1 micron to 10 microns.

In some embodiments, as shown in FIG. 6A, the width $W_1$ of each of the plurality of driving electrodes 122 along the second direction is less than or equal to half the wavelength of the ultrasonic wave emitted from the fingerprint recognition module 100 during operation. For example, under the condition that there is a constant distance between adjacent driving electrodes, the width of the driving electrodes needs to be as great as possible, which may produce the effect of reducing the side lobe and enhancing the main beam. For example, the width of each driving electrode may be designed to be half a wavelength of the ultrasonic wave, or slightly less than half the wavelength.

For example, a driving frequency for the fingerprint recognition module may be 10 MHz, and the wavelength of the ultrasonic wave is about 600 microns. Thus, the width of the driving electrode may be designed to be about 300 microns. When the distance between adjacent receiving electrodes is designed to be 75 microns, each driving electrode may be designed to correspond to four columns or four rows of receiving electrodes.

Figure 7:
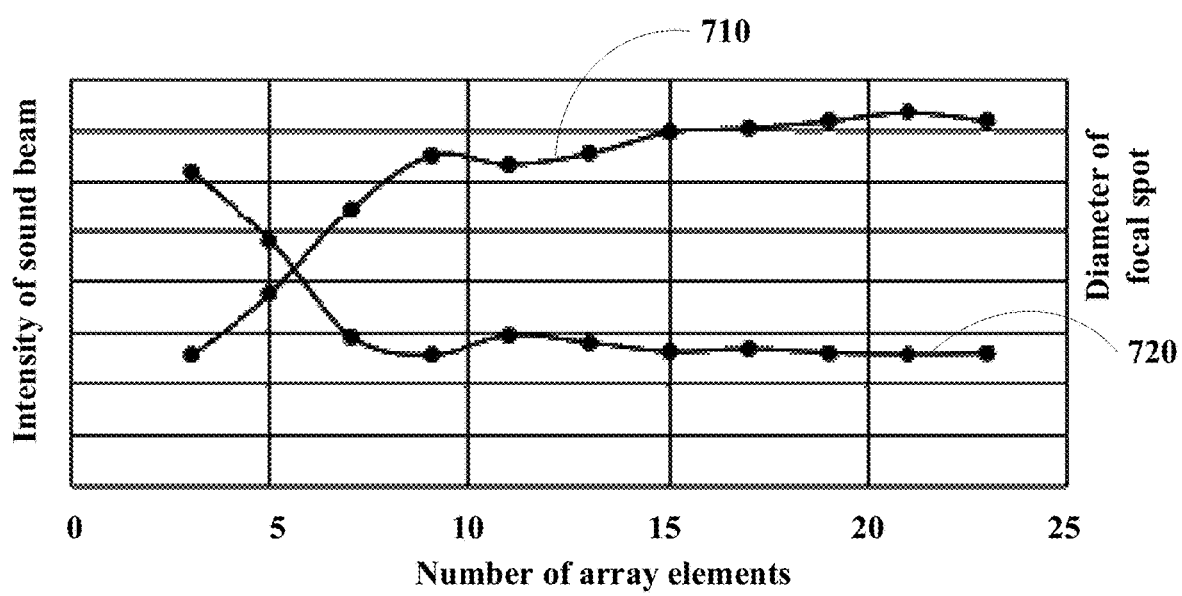
FIG. 7 is a graph showing a relationship curve respectively between an intensity of a sound beam and a diameter of a focal spot at a focus position of an ultrasonic wave and the number of array elements according to an embodiment of the present disclosure.

FIG. 7 is a graph showing a relationship curves respectively between an intensity of a sound beam and a diameter of a focal spot at a focus position of an ultrasonic wave and the number of array elements according to an embodiment of the present disclosure. Here, a driving electrode, multiple receiving electrodes corresponding to the driving electrode, and a portion of the piezoelectric material layer between the driving electrode and the multiple receiving electrodes constitute an array element.

In order to recognize the fingerprint valleys and ridges, it is necessary to meet the requirements of transverse resolution. In some embodiments, a size of the fingerprint valley is generally 100 microns to 200 microns, and a size of the fingerprint ridge is generally 200 microns to 400 microns. In order to discriminate the valleys and the ridges, the diameter of the focal spot of the focused sound beam may be controlled to about 100 microns. In addition, if a fingerprint recognition function with a high valley and ridge discrimination under the screen needs to be realized, the ultrasonic wave that reaches the finger needs to have a focusing intensity that is as great as possible. In order to meet these two requirements, it is necessary to optimize the number of array elements.

FIG. 7 shows a relationship curve 710 of the intensity of the sound beam (i.e., intensity of the wave beam) and the number of array elements and a relationship curve 720 of the diameter of a focal spot and the number of array elements at the focus position. Here, the maximum displacement (unit: micron) of vibration of the substrate at the focusing position of an ultrasonic wave may be used to characterize the intensity of the sound beam; the diameter of the focal spot refers to the diameter (unit: micron) of the focal spot of the ultrasonic wave at the focusing position. As shown in FIG. 7, increasing the number of array elements may increase the intensity of the sound beam at the focus position, and also reduce the diameter of the focal spot. When there is an adequate number (e.g., 8 to 10) of array elements, the increase in the intensity of the focused sound beam slows down, and the decrease in the diameter of the focal spot also slows down. Therefore, in order to form a linear focus, the number of array elements may be 8 to 10 each time the array elements are driven. That is, each time an array element is driven, a driving voltage may be applied to 8 to 10 driving electrodes. This may also save the number of array elements each time the array elements are driven. Of course, those skilled in the art can understand that the scope of the embodiments of the present disclosure is not limited thereto. For example, each time the array elements are driven, a driving voltage may be applied to other numbers (e.g., 7, 11 or the like) of driving electrodes.

Figure 8:
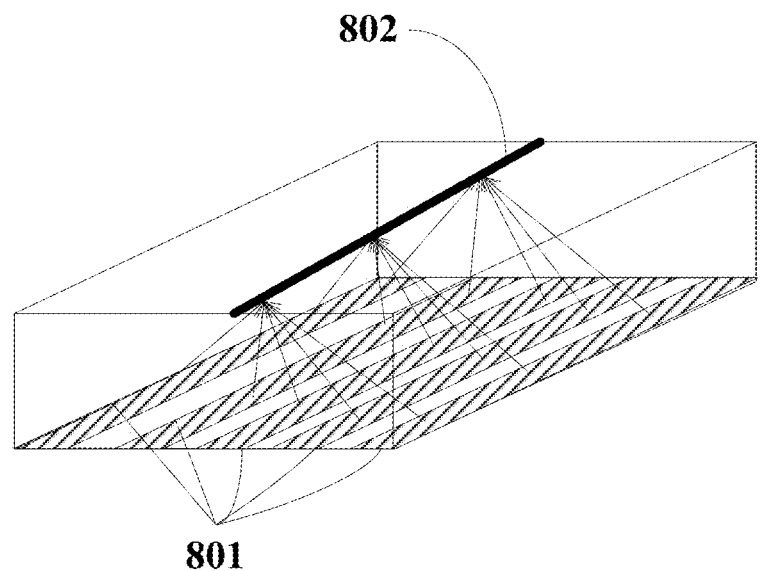
FIG. 8 is a schematic view showing focusing of an ultrasonic wave emitted from a linear array element according to an embodiment of the present disclosure.

FIG. 8 is a schematic view showing focusing of an ultrasonic wave emitted from a linear array element according to an embodiment of the present disclosure.

In some embodiments, as shown in FIG. 8, the above-described array element is a linear array element 801. As shown in FIG. 8, several (e.g., 5) linear array elements 801 are driven based on a focus position (i.e., at a finger on the substrate surface) to form a strip focal spot 802 on the substrate surface. A width of the focal spot is the diameter of the focal spot. A length of the strip focal spot is approximately a length of the linear array element. Therefore, a linear sound source that focuses a sound beam is formed on the substrate. With the linear sound source acting on different positions of a fingerprint of the finger, since the fingerprint valleys and ridges of the finger have different reflectances to the sound wave, the echoes reflected by the fingerprint have different intensities, so that it is possible to realize fingerprint recognition by the linear sound source that focuses a sound beam.

As shown in FIG. 8, the focus of the ultrasonic wave is realized directly above the array element in the middle position among the 5 array elements. First, a drive voltage is input to the two array elements 801 located on the outermost side to drive the two array elements to emit ultrasonic waves. After a certain delay time, a driving voltage is input to the two array elements 801 on the near outer side to drive the two array elements to emit ultrasonic waves. After a certain delay time, a driving voltage is input to the array element 801 in the middle position to drive the element to emit an ultrasonic wave. Each array element is driven at a different moment, so that ultrasonic waves with a phase difference are emitted. These ultrasonic waves when reaching a focus position have the same phase to implement enhancing the interference, thereby focusing an ultrasonic wave.

Figure 9A:
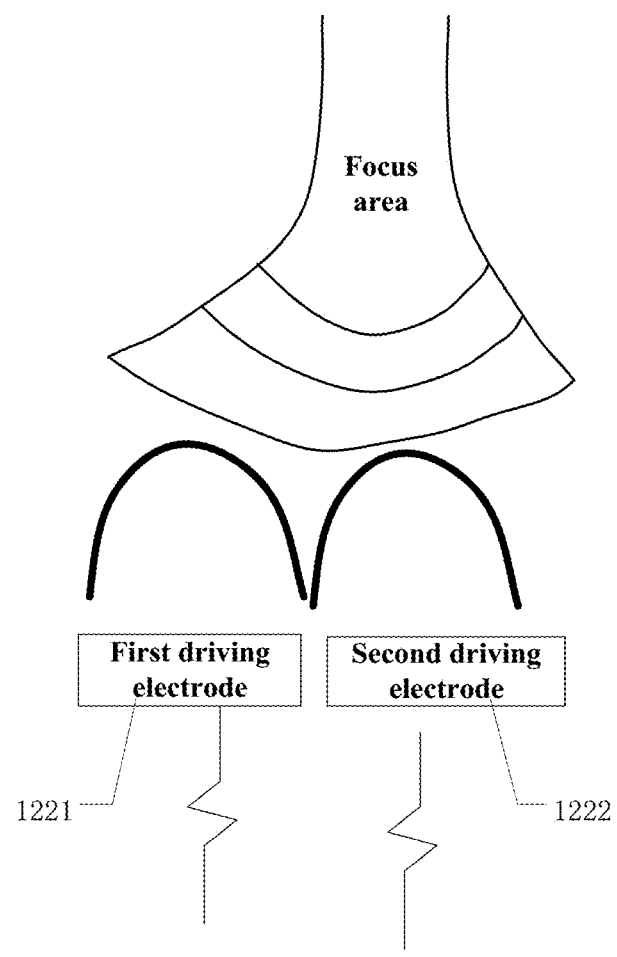
FIG. 9A is a schematic view showing that a fingerprint recognition module realizes ultrasonic wave focusing according to an embodiment of the present disclosure.

FIG. 9A is a schematic view showing that a fingerprint recognition module realizes ultrasonic wave focusing according to an embodiment of the present disclosure. As shown in FIG. 9A, the plurality of driving electrodes 122 comprise a first driving electrode 1221 and a second driving electrode 1222. A driving voltage (e.g., an alternating voltage) is applied to the first driving electrode 1221 at a first time point so as to drive a portion of the piezoelectric material layer corresponding to the first driving electrode 1221 to emit an ultrasonic wave. Then, a driving voltage is applied to the second driving electrode 1222 at a second time point so as to drive a portion of the piezoelectric material layer corresponding to the second driving electrode 1222 to emit an ultrasonic wave, a phase of which is delayed from a phase of the ultrasonic wave emitted from the portion of the piezoelectric material layer corresponding to the first driving electrode 1221, so that it is possible to focus an ultrasonic wave (i.e., constructive interference) directly above the second driving electrode 1222 (or located at other positions where the second driving electrode 1222 is remote from the first driving electrode 1221). This may enhance the intensity or energy of the ultrasonic wave directly above the second driving electrode 1222, so that the fingerprint recognition module may not only realize fingerprint recognition, but also penetrate the finger to discriminate whether the fingerprint is a fingerprint on real skin. It should be noted that the second time point described above is delayed from the first time point. It should be noted that the delay amount of the phase of the ultrasonic wave emitted from the portion of the piezoelectric material layer corresponding to the second driving electrode from the phase of the ultrasonic wave emitted from the portion of the piezoelectric material layer corresponding to the first driving electrode may be obtained by test or calculation according to actual conditions.

Figure 9B:
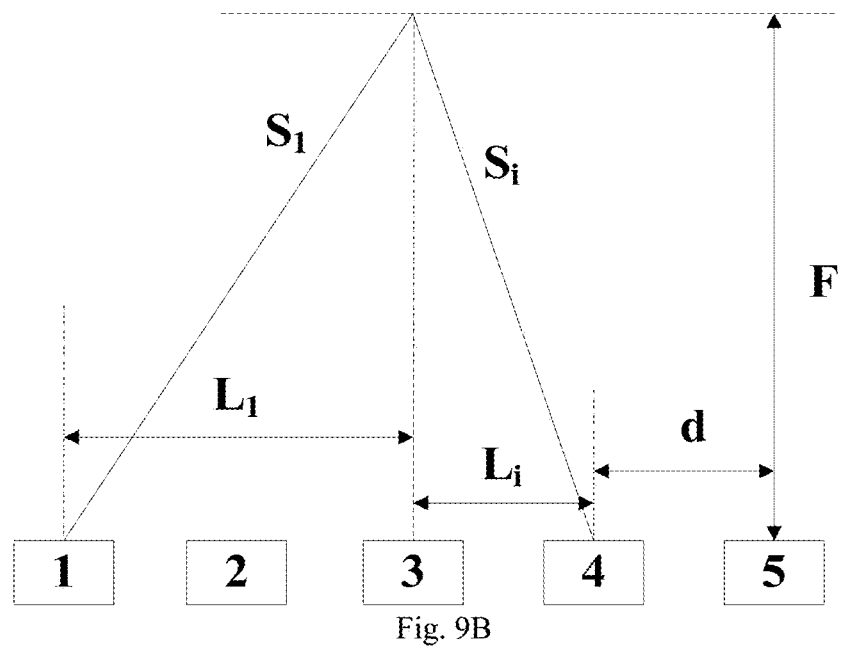
FIG. 9B is a schematic view showing calculating delay time according to an embodiment of the present disclosure.

In some embodiments, the time difference (i.e., delay time) when two driving electrodes are driven obtained by calculation. FIG. 9B is a schematic view showing calculating delay time according to an embodiment of the present disclosure. The method of calculating the delay time will be described in detail below in conjunction with FIG. 9B.

FIG. 9B shows five array elements 1 to 5. The array element 1 and the array element 4 are driven to emit ultrasonic waves, which are focused above the array element 3. Then, a distance $S_i$ between an i-th element and a focus position is $$S_i = \sqrt{F^2 + L_i^2}, \quad (1)$$

wherein F is a distance between each array element and the horizontal plane where the ultrasonic focusing position is situated (or a distance between each array element and the substrate), and $L_i$ is a horizontal distance between the i-th array element and the focus position. For example, $L_i$ is a distance between the i-th array element and a array element below the focus position.

Here, $L_i$ is $$L_i = |j-i| \cdot d, \quad (2)$$

wherein j is a serial number of the array element directly below the position where the ultrasonic focusing occurs. For example, as shown in FIG. 9B, j=3. d is a distance between adjacent array elements, also namely, a distance between adjacent driving electrodes.

Then, the delay time $\tau_i$ of the ultrasonic wave emitted from the i-th element relative to the first element is calculated as follows:

$$\tau_i = \frac{S_1 - S_i}{c} = \frac{\sqrt{F^2 + L_1^2} - \sqrt{F^2 + L_i^2}}{c}, \quad (3)$$

wherein c is a propagation speed of the ultrasonic wave, $S_1$ is a distance between the first array element and the focus position, and $L_1$ is a horizontal distance between the first array element and the focus position.

For example, in the case of i=4, the above-described expression (3) is as follows:

$$\tau_4 = \frac{S_1 - S_4}{c} = \frac{\sqrt{F^2 + L_1^2} - \sqrt{F^2 + L_4^2}}{c}. \quad (4)$$

Figure 9C:
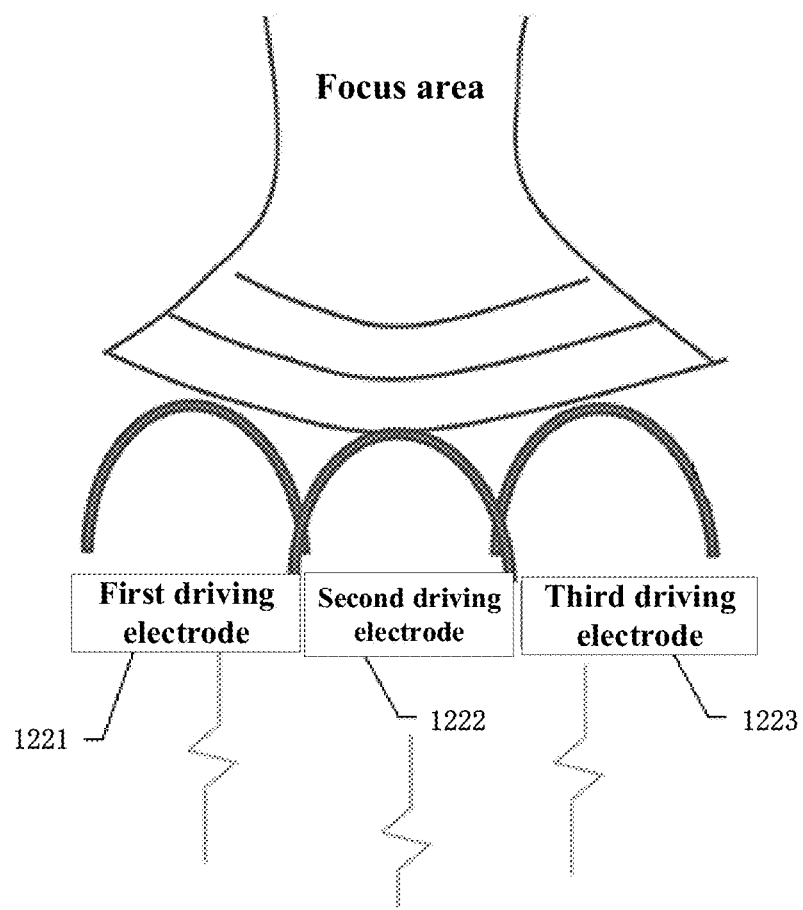
FIG. 9C is a schematic view showing that a fingerprint recognition module realizes ultrasonic focusing according to another embodiment of the present disclosure.

FIG. 9C is a schematic view showing that a fingerprint recognition module realizes ultrasonic focusing according to another embodiment of the present disclosure. As shown in FIG. 9C, the plurality of driving electrodes 122 comprise a first driving electrode 1221, a second driving electrode 1222, and a third driving electrode 1223. A driving voltage is applied to the first driving electrode 1221 and the third driving electrode 1223 at a first time point so as to drive a portion of the piezoelectric material layer corresponding to the first driving electrode 1221 and the third driving electrode 1223 to emit an ultrasonic wave; and a driving voltage is applied to the second driving electrode 1222 at a second time point so as to drive a portion of the piezoelectric material layer corresponding to the second driving electrode 1222 to emit an ultrasonic wave, a phase of which is delayed from a phase of the ultrasonic wave emitted from the portion of the piezoelectric material layer corresponding to the first driving electrode 1221 and the third driving electrode 1223, thereby focusing the ultrasonic wave (i.e., constructive interference) directly above the second driving electrode 1222. This may enhance the intensity or energy of the ultrasonic wave directly above the second driving electrode 1222, so that the fingerprint recognition module may not only realize the fingerprint recognition, but also penetrate the finger and discriminate whether the fingerprint is a fingerprint on real skin.

It should be noted that although FIG. 9C shows that the ultrasonic wave is focused above the second driving electrode located in the middle position, the scope of the embodiments of the present disclosure is not limited thereto.

For example, a driving voltage may be applied to the first driving electrode 1221 and the second driving electrode 1222 at a first time point so as to drive a portion of the piezoelectric material layer corresponding to the first driving electrode 1221 and the second driving electrode 1223 to emit an ultrasonic wave; and a driving voltage is applied to the third driving electrode 1223 at a second time point so as to drive a portion of the piezoelectric material layer corresponding to the third driving electrode 1223 to emit an ultrasonic wave, a phase of which is delayed from a phase of the ultrasonic wave emitted from the portion of the piezoelectric material layer corresponding to the first driving electrode 1221 and the second driving electrode 1222, thereby focusing the ultrasonic wave directly above the third driving electrode 1223.

For another example, a driving voltage may be applied to the second driving electrode 1222 and the third driving electrode 1223 at a first time point so as to drive a portion of the piezoelectric material layer corresponding to the second driving electrode 1222 and the third driving electrode 1223 to emit an ultrasonic wave; and a driving voltage is applied to the first driving electrode 1221 at a second time point so as to drive a portion of the piezoelectric material layer corresponding to the first driving electrode 1221 to emit an ultrasonic wave, a phase of which is delayed from a phase of the ultrasonic wave emitted from the portion of the piezoelectric material layer corresponding to the second driving electrode 1222 and the third driving electrode 1223, thereby focusing the ultrasonic wave directly above the first driving electrode 1221.

Therefore, the ultrasonic wave may be focused either directly above the central array element or at other positions above the array element. Therefore, by inputting driving voltages with different phase delays to the driving electrodes, focusing of ultrasonic waves at different positions may be achieved.

In the above embodiments, as shown in FIG. 9A and FIG. 9C, two or more driving electrodes are respectively driven to emit ultrasonic waves, which are focused directly above the driving electrodes with a delayed drive. Accordingly, the ultrasonic receiving element constituted by receiving electrodes corresponding to (overlapping with) the driving electrodes with the delayed drive may be turned on according to the reflected echo time of the driving electrodes with the delayed drive to receive the reflected echo.

It should be noted that when the method shown in FIG. 9A or 9C is used to drive a plurality of driving electrodes, two or more driving electrodes may be used as a group of driving electrode groups, and within each of the driving electrode groups, a delayed drive may be performed according to the method shown in FIG. 9A or 9C. However, different driving electrode groups which do not affect each other, may perform simultaneous drive or scanned drive, thereby reducing the recognition time of the entire fingerprint recognition module.

Figure 10A:
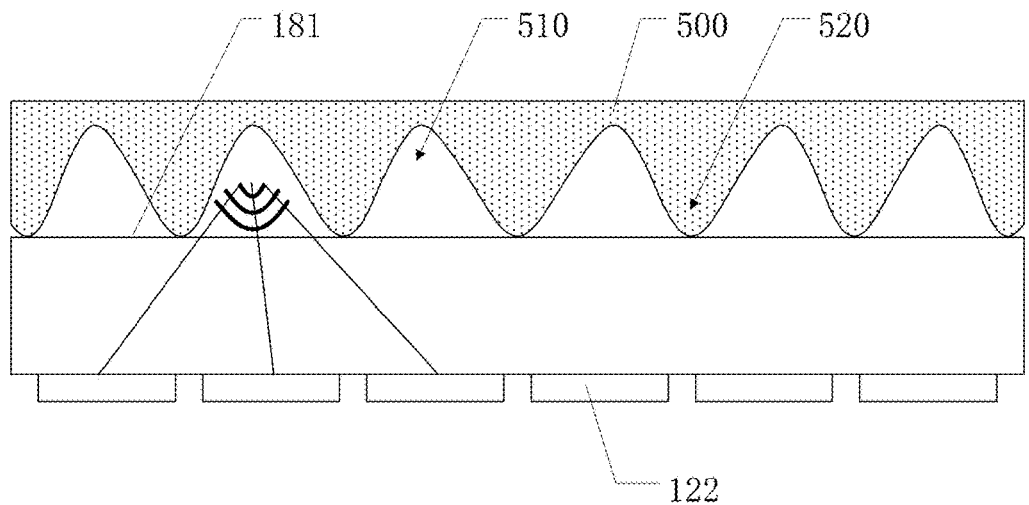
FIG. 10A is a schematic view showing that an ultrasonic wave emitted from a fingerprint recognition module is focused on valleys of a fingerprint according to an embodiment of the present disclosure.
Figure 10B:
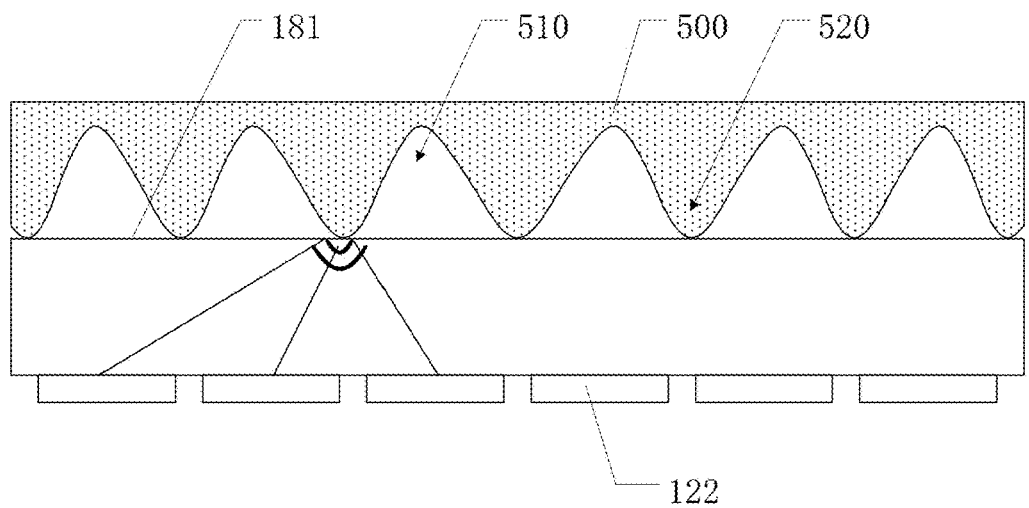
FIG. 10B is a schematic view showing that an ultrasonic wave emitted from a fingerprint recognition module is focused on ridges of a fingerprint according to an embodiment of the present disclosure.

FIG. 10A is a schematic view showing that an ultrasonic wave emitted from a fingerprint recognition module is focused on valleys of a fingerprint according to an embodiment of the present disclosure. FIG. 10B is a schematic view showing that an ultrasonic wave emitted from a fingerprint recognition module is focused on ridges of a fingerprint according to an embodiment of the present disclosure.

As shown in FIG. 10A, when the ultrasonic wave emitted from the above-described fingerprint recognition module is focused on the valleys 510 of the fingerprint 500, the ultrasonic wave reflected by the valleys 510 have more energy or intensity. As shown in FIG. 10B, when the ultrasonic wave emitted from the above-described fingerprint recognition module is focused on the ridges 520 of the fingerprint 500, the ultrasonic wave reflected by the ridges 520 have less energy or intensity. Therefore, there is also a greater difference between the intensity or energy of the ultrasonic waves reflected by the valleys 510 and the ridges 520 of the fingerprint 500, thereby facilitating improving the fingerprint recognition performance. On the other hand, as shown in FIGS. 10A and 8B, the ultrasonic wave emitted from the fingerprint recognition module have a better directivity, so that the crosstalk between the ultrasonic waves reflected by the valleys and ridges of the fingerprint may be reduced, which may improve the fingerprint recognition performance.

Figure 11A:
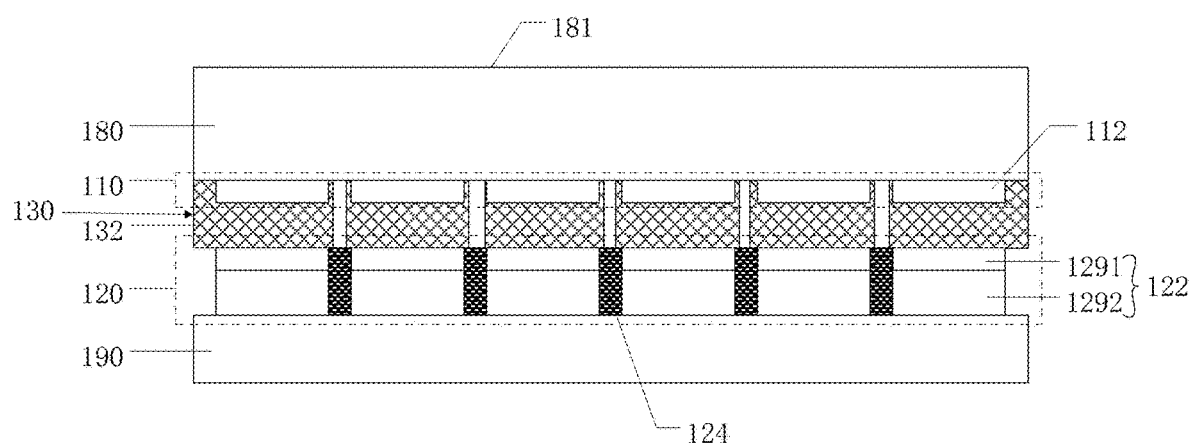
FIG. 11A is a schematic cross-sectional view showing a structure of a fingerprint recognition module according to another embodiment of the present disclosure.
Figure 11B:
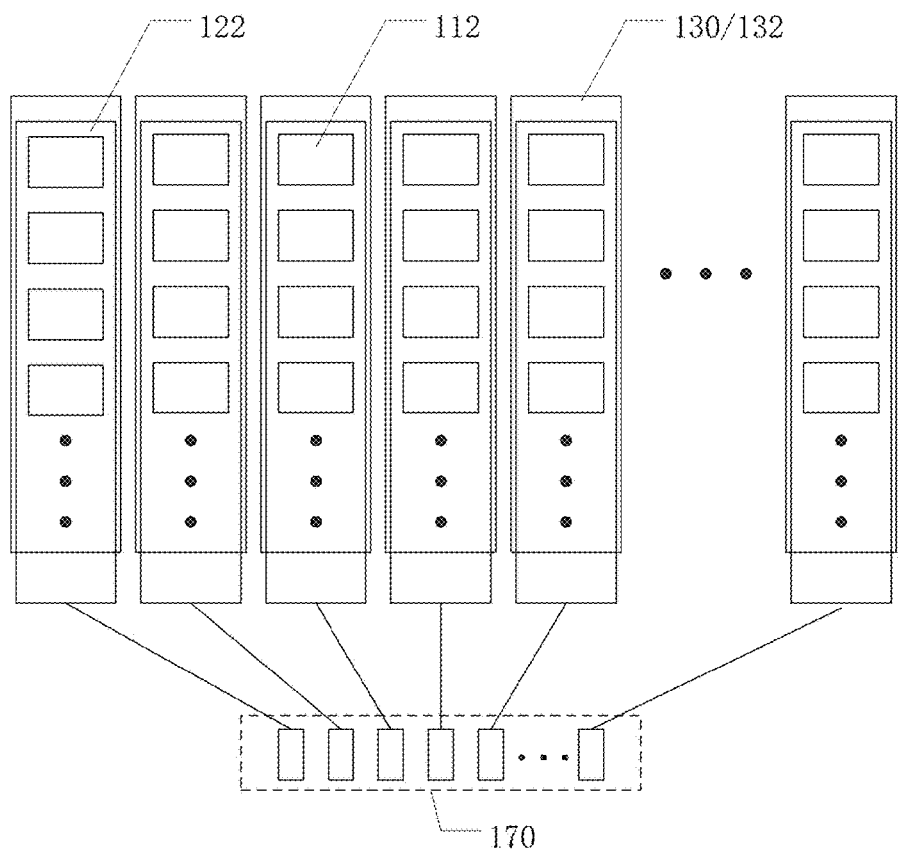
FIG. 11B is a schematic plan view showing a fingerprint recognition module according to another embodiment of the present disclosure.

FIG. 11A is a schematic cross-sectional view showing a structure of a fingerprint recognition module according to another embodiment of the present disclosure. FIG. 11B is a schematic plan view showing a fingerprint recognition module according to another embodiment of the present disclosure. As shown in FIGS. 11A and 11B, the piezoelectric material layer 130 may comprise a plurality of sub-piezoelectric material layers 132 arranged along the second direction. The plurality of sub-piezoelectric material layers 132 are disposed in one-to-one correspondence with the plurality of driving electrodes 122. The driving electrode 122, the sub-piezoelectric material layer 132 corresponding to the driving electrode 122, and multiple receiving electrodes 112 arranged along the first direction that overlap with the driving electrode 122 may constitute an ultrasonic emitting element, thereby reducing mutual interference between different driving electrodes 122. It should be noted that the piezoelectric material layer may be further patterned into a plurality of sub-piezoelectric material blocks in one-to-one correspondence to the plurality of receiving electrodes. Here, the embodiments of the present disclosure will not be described in detail.

In other embodiments, for a case where each driving electrode corresponds to a plurality of receiving electrode groups, the piezoelectric material layer may also comprise a plurality of sub-piezoelectric material layers arranged along the second direction, which are in one-to-one correspondence to the plurality of driving electrodes.

Figure 12:
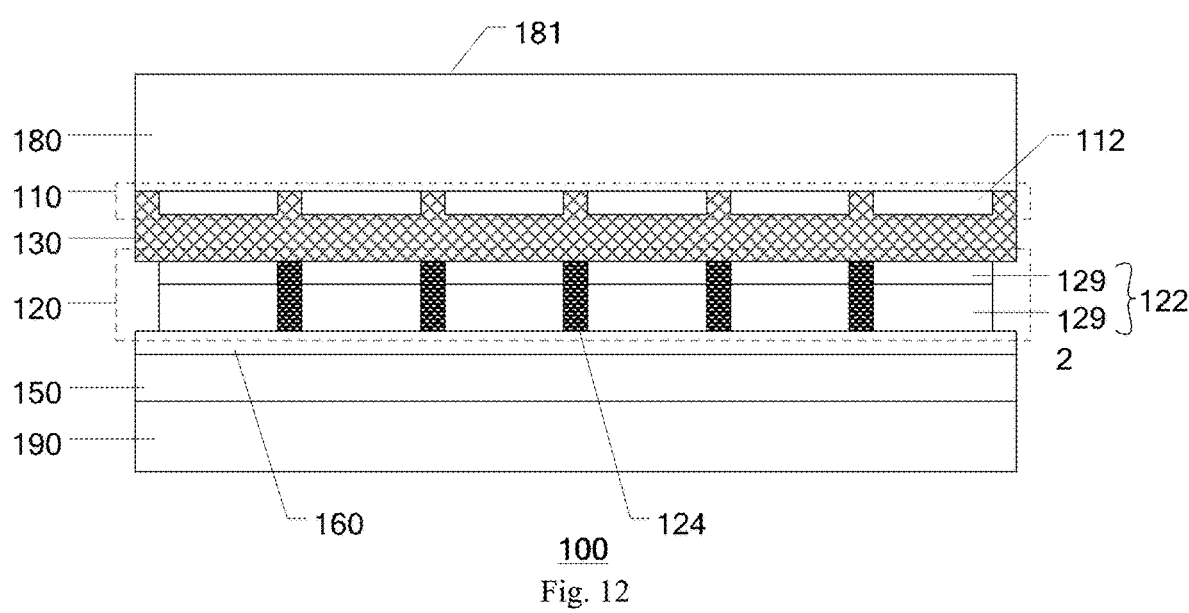
FIG. 12 is a schematic structural view showing a fingerprint recognition module according to another embodiment of the present disclosure.

FIG. 12 is a schematic structural view showing a fingerprint recognition module according to another embodiment of the present disclosure. Optionally, as shown in FIG. 12, the fingerprint recognition module may further comprise a reflective layer 150 and an insulating layer 160. The reflective layer 150 is located on a side of the driving electrode layer 120 remote from the piezoelectric material layer 130. The insulating layer 160 is located between the reflective layer 150 and the driving electrode layer 120. The reflective layer 150 may reflect the ultrasonic wave generated by the piezoelectric material layer 120 and propagated toward the reflective layer 150 toward the receiving electrode layer 110, thereby facilitating enhancing the intensity or energy of the emitted ultrasonic wave.

For example, the reflective layer 150 may be made of silver (Ag), and the insulating layer 160 may be made of silicon nitride (SiNx). Certainly, the embodiments of the present disclosure comprise, but are not limited thereto. The reflective layer 150 may also be made of other materials having the characteristic of reflecting an ultrasonic wave, and the insulating layer 160 may be made of other insulating materials such as resin.

Figure 13:
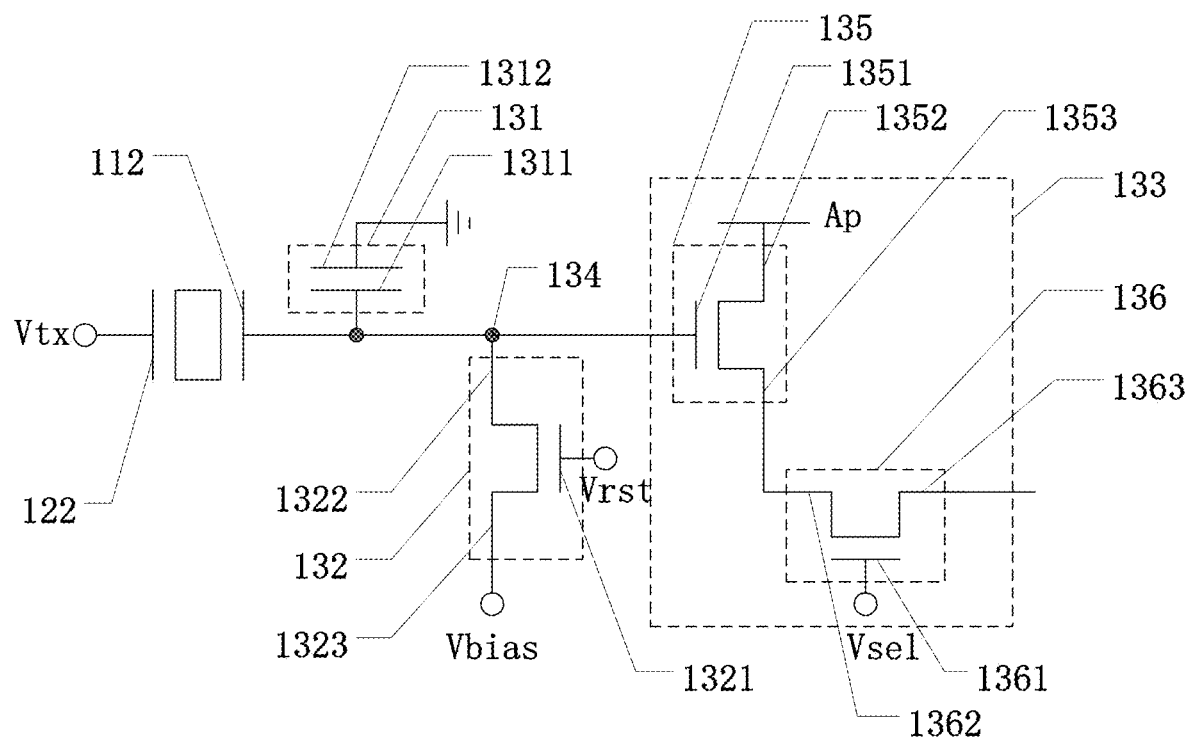
FIG. 13 is a schematic view showing a driving circuit of a fingerprint recognition module according to an embodiment of the present disclosure.

FIG. 13 is a schematic view showing a driving circuit of a fingerprint recognition module provided according to an embodiment of the present disclosure.

In some embodiments, the fingerprint recognition module may further comprise a plurality of driving circuits 130. For example, the plurality of driving circuits 130 may be disposed on the substrate (e.g., the substrate 180 shown in FIG. 5A or 6A). The plurality of driving circuits 130 are electrically connected to the plurality of receiving electrodes in a one-to-one correspondence. As shown in FIG. 13, each of the plurality of driving circuits 130 may comprise a storage capacitor 131, a first thin film transistor 132, and a signal reading sub-circuit 133. The storage capacitor 131 comprises a first electrode 1311 and a second electrode 1312. The first thin film transistor 132 comprises a first gate 1321, a first source 1322, and a first drain 1323. For each driving circuit, a receiving electrode 112 electrically connected to the each driving circuit, the first source 1322, and the first electrode 1311 are electrically connected to a storage node 134, so that the fingerprint electrical signal received by the receiving electrode 112 may be stored in the storage capacitor 131. That is, for each driving circuit, the receiving electrode 112 electrically connected to the each driving circuit is electrically connected to the first source 1322 and the first electrode 1311. The second electrode 1312 of the storage capacitor may be grounded. The first gate 1321 may be configured to receive a turn-on signal Vrst. The first drain 1323 may be configured to receive a bias voltage Vbias. The signal reading sub-circuit 133 is configured to read a fingerprint electric signal stored in the storage capacitor 131. In addition, during the process of storing the fingerprint electrical signal received by the receiving electrode 112 in the storage capacitor 131, the bias voltage Vbias may be applied to the first drain 1323, so that an alternating voltage received by the receiving electrode 112 is raised so as to obtain a detection signal with a high contrast.

In some embodiments, the first thin film transistor 132 may be an oxide thin film transistor, such as an indium gallium zinc oxide (IGZO) thin film transistor. After the fingerprint electrical signal received by the receiving electrode 112 is stored in the storage capacitor 131, the voltage of the storage node 134 may have leakage current from the piezoelectric structure corresponding to the receiving electrode 112 and the first thin film transistor. The leakage current level of the piezoelectric structure is $10^{-15}$ A, the leakage current level of the low temperature polysilicon thin film transistor is $10^{-12}$ A, and the leakage current level of the oxide thin film transistor (e.g., IGZO thin film transistor) is $10^{-15}$ A. Therefore, when the thin film transistor 132 is the oxide thin film transistor, it is possible to reduce the overall leakage current of the driving circuit, thereby ensuring the stability of the fingerprint electrical signal on the storage node 134, and thereby improving the fingerprint recognition performance of the fingerprint recognition module.

In some embodiments, as shown in FIG. 13, the signal reading sub-circuit 133 may comprise a second thin film transistor 135 and a third thin film transistor 136. The second thin film transistor 135 comprises a second gate 1351, a second source 1352, and a second drain 1353. The third thin film transistor 136 comprises a third gate 1361, a third source 1362, and a third drain 1363. The second gate 1351 is electrically connected to the storage node 134. That is, the second gate 1351 is electrically connected to the first electrode 1311 of the storage capacitor. The second drain 1353 is electrically connected to the third source 1362. The second source 1352 is configured to receive a fixed voltage Ap. The third gate 1361 is configured to receive a read instruction signal Vsel. The third drain 1363 is configured to output an electrical signal corresponding to the fingerprint electrical signal, so that it is possible to read the fingerprint electrical signal stored in the storage capacitor 131.

In the present embodiment, the electrical signal stored by the storage capacitor 131 may turn on the second thin film transistor 135, and different electrical signals stored by the storage capacitor may result in different currents when the second thin film transistor is turned on, so that it is possible to reflect different fingerprint signals. After the third thin film transistor 136 is turned on, it is possible to output the conduction current of the second thin film transistor, that is, to output an fingerprint electrical signal. Such circuit structure may amplify the fingerprint electrical signal, thereby facilitating recognition of fingerprint information.

Figure 14:
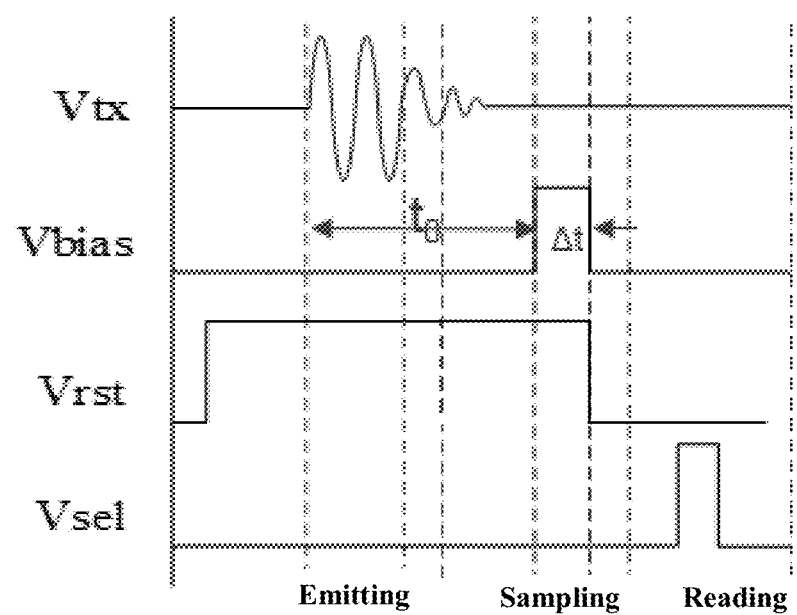
FIG. 14 is a timing chart showing a driving method for a fingerprint recognition module according to an embodiment of the present disclosure.

FIG. 14 is a timing chart showing a driving method for a fingerprint recognition module according to an embodiment of the present disclosure. As shown in FIG. 14, when a driving voltage Vtx is applied to a driving electrode so as to drive a piezoelectric material layer corresponding to the driving electrode to emit an ultrasonic wave, a turn-on signal Vrst is applied to the first gate to turn on the first thin film transistor, thereby eliminating an aftershock. According to the arrival time of the surface echo (e.g., delay to from the start of emitting an ultrasonic wave), a bias voltage Vbias is applied to the first drain to raise the fingerprint electrical signal on the receiving electrode and store the raised fingerprint electrical signal in the storage capacitor. The signal reading sub-circuit is used to read out the raised fingerprint electrical signal. For example, a read instruction signal Vsel is applied to the third gate. It should be noted that the timing chart shown in FIG. 14 is only an example provided by the present disclosure, and the driving circuit provided by the embodiments of the present disclosure may also be driven by other timings according to actual conditions.

In the above-described embodiments, each receiving electrode is electrically connected to a corresponding driving circuit. Since all the receiving electrodes are arranged in an array, all the driving circuits may also be arranged in an array.

Figure 15:
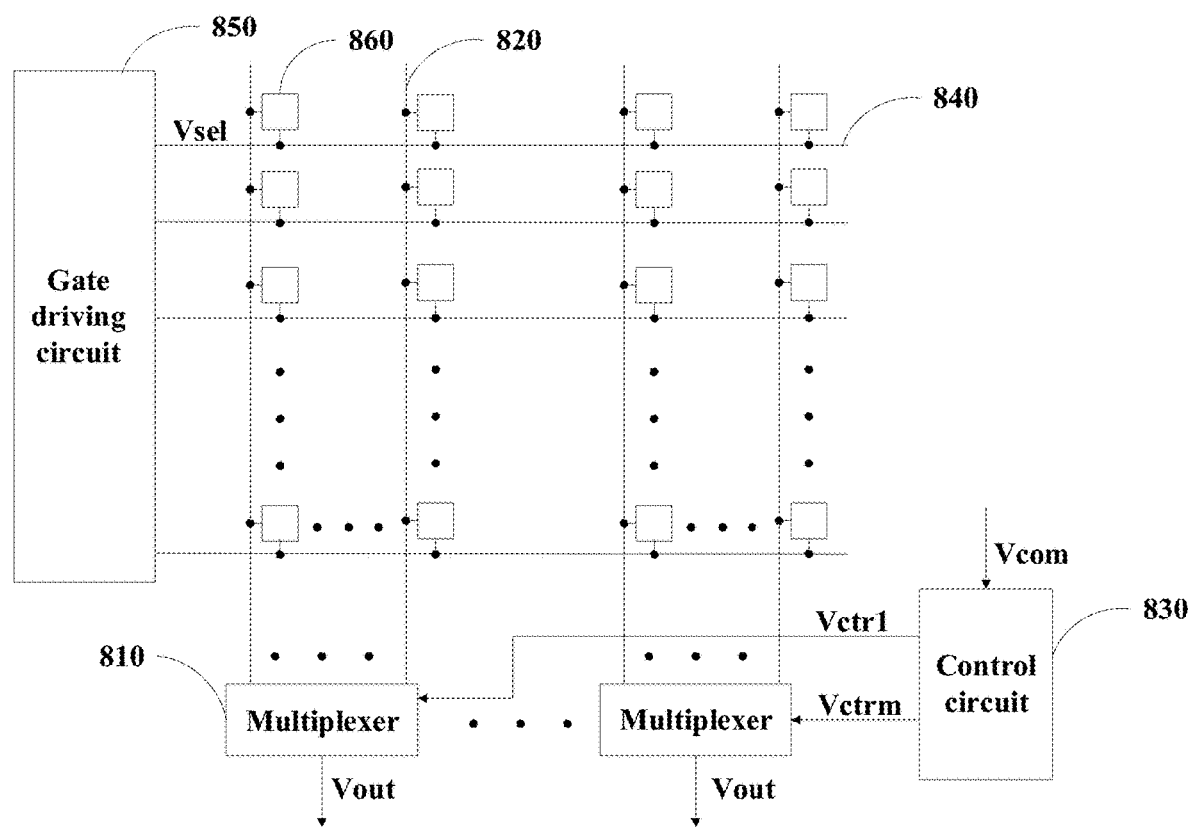
FIG. 15 is a schematic view showing a circuit connection of a fingerprint recognition module according to an embodiment of the present disclosure.

FIG. 15 is a schematic view showing a circuit connection of a fingerprint recognition module according to an embodiment of the present disclosure.

As shown in FIG. 15, the fingerprint recognition module may further comprise a plurality of multiplexers 810, a plurality of groups of data signal lines 820, a control circuit 830, a plurality of gate lines 840 and a gate driving circuit 850. In addition, FIG. 15 also shows a plurality of driving circuits 860 arranged in an array. For example, each driving circuit 860 may be the driving circuit as shown in FIG. 13. Each driving circuit is electrically connected to a corresponding receiving electrode (not shown in FIG. 15).

Each multiplexer is configured to select and output the electrical signal Vout (the electrical signal may be regarded as an amplified fingerprint electrical signal) corresponding to the fingerprint electrical signal. That is, each of the plurality of multiplexers respectively selects one data signal line from a plurality of data signal lines electrically connected thereto to output a corresponding electrical signal Vout.

Each group of data signal lines 820 may comprise multiple data signal lines. The multiple groups of data signal lines are electrically connected to the plurality of multiplexers in one-to-one correspondence. That is, multiple data signal lines electrically connected to a multiplexer are a group of data signal lines. Each of the multiple data signal lines 820 is electrically connected to third drains 1363 of third thin film transistors 136 of a plurality of driving circuits arranged along the first direction (e.g., a column direction).

The control circuit 830 is electrically connected to the plurality of multiplexers 810. The control circuit 830 is configured to control the plurality of multiplexers to select and output the electrical signal corresponding to the fingerprint electrical signal. That is, the control circuit 830 is configured to control the plurality of multiplexers respectively select and output an electric signal of a respective route. For example, the control circuit may be configured to receive an operation instruction signal Vcom, and respectively send control signals Vctrl to Vctrm to each of the multiplexers 810 according to the operation instruction signal, so as to control each of the multiplexers 810 to respectively select and receive the respective fingerprint electrical signals.

Each of the plurality of gate lines 840 is electrically connected to third gates 1361 of third thin film transistors 136 of a plurality of driving circuits arranged along the second direction.

The gate driving circuit 850 is electrically connected to the plurality of gate lines 840. The gate driving circuit 850 is configured to provide the read instruction signal Vsel.

In some embodiments, a number of columns of the driving circuits controlled by a multiplexer is: $n_1 \times m_1$, where $n_1$ is a number of columns of receiving electrodes corresponding to the linear array element (or the driving electrode), and $m_1$ is a number of the linear array elements (or driving electrodes) required by single focusing. For example, taking every four columns of receiving electrodes corresponding to a driving electrode, and 800 columns of receiving electrodes as an example, a total of 200 linear array elements (or driving electrodes) are obtained. Among these 200 linear array elements, adjacent 8 linear array elements are used as a group, so 25 linear sound sources may be focused in each drive. The data lines may be controlled by twenty-five 32-route multiplexers (32 is 4×8, i.e. the number of columns of receiving electrodes corresponding to each group of linear array elements).

In some embodiments, it is possible to perform focusing on the substrate surface directly above the 32×25 columns of receiving electrodes respectively by controlling a delay solution. Since each group of linear array elements comprises 32 columns of receiving electrodes, each group of linear array elements may sequentially start 32 delay solutions to form 32 times of ultrasonic focusing. During each ultrasonic focusing, the receiving electrode column directly below the focusing position may be used as an output column, so as to output an electric signal (as a fingerprint electric signal) through a corresponding driving circuit and a corresponding multiplexer.

In the above-described embodiments, the read instruction signal is provided by the gate driving circuit, and a route of electrical signals is selected and output by a multiplexer, so that the output of the fingerprint electrical signal is realized.

Figure 16:
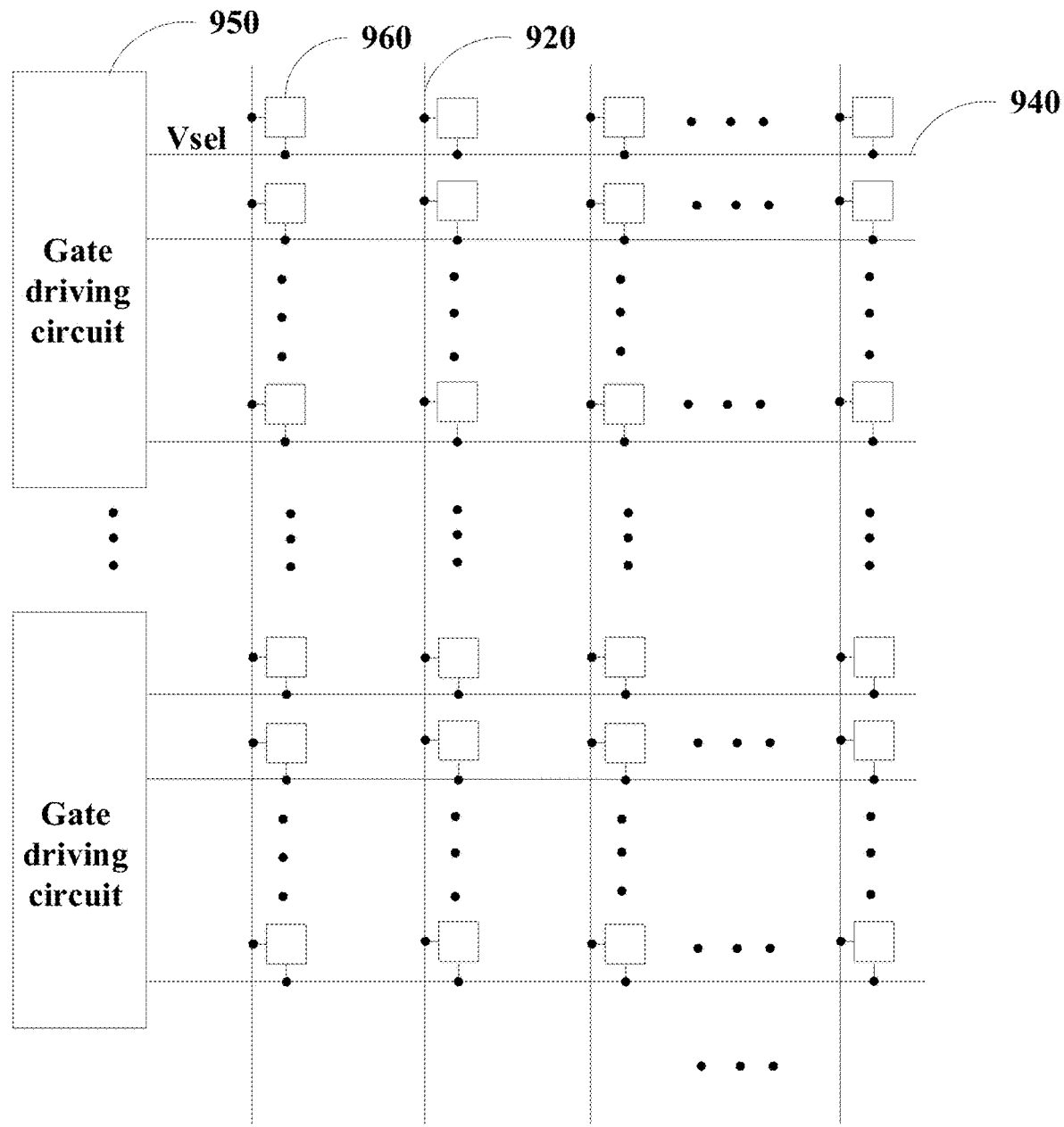
FIG. 16 is a schematic view showing a circuit connection of a fingerprint recognition module according to another embodiment of the present disclosure.

FIG. 16 is a schematic view showing a circuit connection of a fingerprint recognition module according to another embodiment of the present disclosure.

As shown in FIG. 16, the fingerprint recognition module may further comprise a plurality of gate driving circuits 950, a plurality of groups of gate lines 940 and a plurality of data signal lines 920. In addition, FIG. 16 also shows a plurality of driving circuits 960 arranged in an array. For example, each driving circuit 960 may be the driving circuit as shown in FIG. 13. Each driving circuit is electrically connected to a corresponding receiving electrode (not shown in FIG. 16).

Each gate driving circuit 950 may be configured to provide the read instruction signal Vsel.

Each group of gate lines 940 may comprise a plurality of gate lines 940. The plurality of groups of gate lines 940 are electrically connected to the plurality of gate driving circuits in one-to-one correspondence. That is, a plurality of gate lines electrically connected to a gate driving circuit are a group of gate lines. Each of the plurality of gate lines 940 is electrically connected to third gates 1361 of third thin film transistors 136 of a plurality of driving circuits 960 arranged along the first direction (e.g., a row direction).

Each of the plurality of data signal lines 920 is electrically connected to third drains 1363 of third thin film transistors 136 of a plurality of driving circuits 960 arranged along the second direction (e.g., a column direction).

In some embodiments, a number of rows of gate lines controlled by each gate driving circuit is: $n_2 \times m_2$, where $n_2$ is a number of rows of receiving electrodes corresponding to the linear array element, and m is a number of linear array elements required for single focusing. For example, taking every four rows of receiving electrodes corresponding to a driving electrode (at this time, the driving electrodes extend along the row direction (as the first direction)) and a total of 1600 rows of receiving electrodes as an example, a total of 400 linear array elements are obtained. Among these 400 linear array elements, 8 adjacent linear array elements are as a group. 50 linear sound sources may be focused in each drive. Therefore, 50 gate driving circuits may be used to provide read instruction signals. Each gate driving circuit is electrically connected to 32 rows of gate lines.

For example, it is possible to perform focusing on the substrate surface directly above 32×50 rows of receiving electrodes respectively by controlling the delay solution. Therefore, each group of linear array elements may sequentially start 32 delay solutions to form 32 times of ultrasonic focusing. Here, each ultrasonic focusing occurs directly above the respective row of receiving electrodes of each group of linear array elements. During the first focusing, the focus position is the position directly above the first row of receiving electrodes of each group of linear array elements. Thus, the gate driving circuit is controlled to provide a read instruction signal to the gate line corresponding to the first row of receiving electrodes in each group of linear array elements. In this way, the first gate line corresponding to each group of linear array elements transmits the read instruction signal to the driving circuit electrically connected to the corresponding receiving electrode, so that the fingerprint electrical signal caused by the focused and returned ultrasonic wave is received. Then, during the second focusing, the focus position is the position directly above the second row of receiving electrodes of each group of linear array elements. Thus, the gate driving circuit is controlled to provide a read instruction signal to the gate line corresponding to the second row of receiving electrodes in each group of linear array elements. In this way, the second gate line corresponding to each group of linear array elements transmits the read instruction signal to the driving circuit electrically connected to the corresponding receiving electrode, so that the fingerprint electrical signal caused by the focused and returned ultrasonic wave is received, and so on.

In some embodiments of the present disclosure, when the ultrasonic wave is focused on the substrate above the receiving electrode in a column or a row, the receiving electrode in the column or the row is used to receive the ultrasonic wave reflected by the fingerprint, thereby realizing fingerprint recognition.

In some embodiments of the present disclosure, a display device is also provided. The display device may comprise the fingerprint recognition module as described above.

Figures 17, 18:
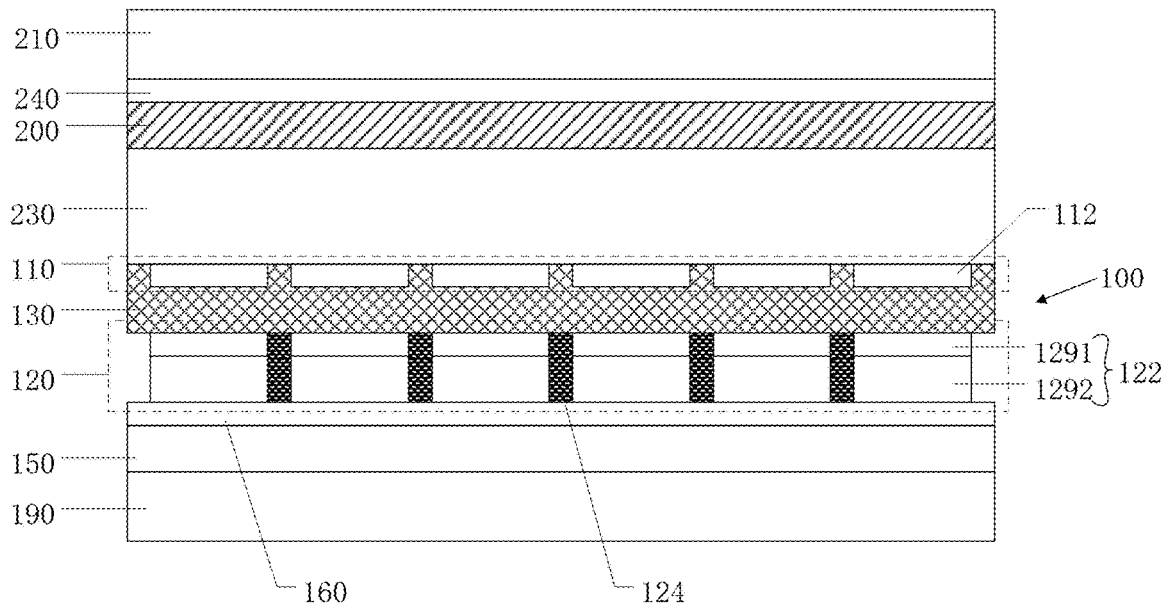
FIG. 17 is a schematic structural view showing a display device according to an embodiment of the present disclosure.
FIG. 18 is a flowchart showing a driving method for a fingerprint recognition module according to an embodiment of the present disclosure.

FIG. 17 is a schematic structural view showing a display device according to an embodiment of the present disclosure. The display device comprises the fingerprint recognition module (e.g., the fingerprint recognition module 100) provided in the above-described embodiments. Thus, the display device may focus (i.e., constructive interference) the ultrasonic wave by driving the plurality of driving electrodes described above respectively. On the one hand, the intensity or energy of the emitted ultrasonic wave in a specific area or a specific direction may be enhanced, thereby improving the fingerprint recognition performance. On the other hand, it is possible to cause the emitted ultrasonic wave to have a better directivity, which may reduce the crosstalk between the ultrasonic waves reflected by the valleys and ridges of the fingerprint, thereby improving the fingerprint recognition performance. In addition, the display device may also discriminate whether the fingerprint is a fingerprint on real skin by the above-described fingerprint recognition module. Specifically, reference may be made to related descriptions of the foregoing embodiments, and details are not described herein again.

In some embodiments, as shown in FIG. 17, the display device may further comprise a display module 200. An area of the display module 200 is substantially equal to that of the fingerprint recognition module 100, so that full-screen fingerprint recognition may be realized. It should be noted that "substantially equal" here comprises, but is not limited to, "absolutely equal". For example, there may be a certain error, which may be determined according to actual conditions or actual needs. Certainly, the embodiments of the present disclosure comprise, but are not limited thereto. The area of the display module may also not be equal to that of the fingerprint recognition module, and the fingerprint recognition module may be disposed only in an area where fingerprint recognition is required. In embodiments, the fingerprint recognition module may also implement a touch function, so that it is not necessary to provide an additional touch device (e.g., a capacitive touch panel), thereby reducing the cost of the display device.

In some embodiments, as shown in FIG. 17, the display device may further comprise a cover plate 210. The cover plate 210 is located on a side of the display module 200 remote from the fingerprint recognition module 100. For example, the cover plate may be a glass cover plate.

In some embodiments, as shown in FIG. 17, the display device may further comprise a bottom plate 230. The bottom plate 230 is located between the display module 200 and the fingerprint recognition module 100.

In some embodiments, as shown in FIG. 17, the display device may further comprise an adhesive layer 240. The adhesive layer 240 is used for bonding the display module 200 and the cover plate 210. In other embodiments, the display module 200 and the bottom plate 230 may be bonded by using the adhesive layer.

For example, the display device may be an electronic device with a display function, such as a television, a mobile phone, a computer, a notebook computer, an electronic album, a navigator, or the like.

FIG. 18 is a flowchart showing a driving method for a fingerprint recognition module according to an embodiment of the present disclosure. The fingerprint recognition module may be the fingerprint recognition module in the above-described embodiments. As shown in FIG. 18, the driving method may comprise steps S10010 to S10020.

At step S10010, a driving voltage is applied to a driving electrode to drive a portion of the piezoelectric material layer corresponding to the driving electrode to emit an ultrasonic wave.

At step S10020, the ultrasonic wave reflected by the fingerprint is received using the piezoelectric material layer and a corresponding fingerprint electrical signal is output by the receiving electrode.

In the driving method of the present embodiment, the driving voltage is applied to the driving electrode to drive a portion of the piezoelectric material layer corresponding to the driving electrode to emit an ultrasonic wave, and the ultrasonic wave reflected by a fingerprint is received by the piezoelectric material layer and the corresponding fingerprint electrical signal is output by the receiving electrode. In this way, the fingerprint recognition function is realized.

In some embodiments, the plurality of driving electrodes comprise a first driving electrode and a second driving electrode. The driving method comprises: applying the driving voltage to the first driving electrode at a first time point so as to drive a portion of the piezoelectric material layer corresponding to the first driving electrode to emit an ultrasonic wave; and applying the driving voltage to the second driving electrode at a second time point after the first time point so as to drive a portion of the piezoelectric material layer corresponding to the second driving electrode to emit an ultrasonic wave, a phase of which is delayed from a phase of the ultrasonic wave emitted from the portion of the piezoelectric material layer corresponding to the first driving electrode. Here, the second time point is delayed from the first time point.

Therefore, the driving method may realize the focusing (i.e., constructive interference) of the ultrasonic wave directly above the second driving electrode, that is, the intensity or energy of the ultrasonic wave directly above the second driving electrode may be enhanced, so that the fingerprint recognition may be realized. In addition, the method may also cause the ultrasonic wave to penetrate the finger and discriminate whether the fingerprint is a fingerprint on real skin. It should be noted that the delay amount between the phase of the ultrasonic wave emitted from the piezoelectric material layer corresponding to the above-described second driving electrode and the phase of the ultrasonic wave emitted from the piezoelectric material layer corresponding to the first driving electrode may obtained by test or calculation according to actual conditions. For the specific ultrasonic focusing process, please refer to the related description of FIG. 9A.

In some embodiments, the above-described step S10020 may comprise: turning on the receiving electrode corresponding to (overlapping with) the second driving electrode according to reflected echo time of the second driving electrode so as to receive the reflected echo. Here, the second driving electrode, the receiving electrode, and the piezoelectric material layer therebetween may constitute an ultrasonic receiving element.

In some embodiments, the plurality of driving electrodes may comprise a first driving electrode, a second driving electrode, and a third driving electrode. The second driving electrode is located between the first driving electrode and the third driving electrode. The driving method may comprise: applying the driving voltage to the first driving electrode and the third driving electrode at the first time point so as to drive a portion of the piezoelectric material layer corresponding to the first driving electrode and the third driving electrode to emit an ultrasonic wave; and applying the driving voltage to the second driving electrode at the second time point so as to drive a portion of the piezoelectric material layer corresponding to the second driving electrode to emit an ultrasonic wave, a phase of which is delayed from a phase of the ultrasonic wave emitted from the portion of the piezoelectric material layer corresponding to the first driving electrode and the third driving electrode. The second time point is delayed from the first time point.

Therefore, the driving method may realize the focusing (i.e., constructive interference) of the ultrasonic wave directly above the second driving electrode, and the intensity or energy of the ultrasonic wave directly above the second driving electrode may be further enhanced, thereby realizing the fingerprint recognition. In addition, the method may also cause the ultrasonic wave to penetrate the finger and discriminate whether the fingerprint is a fingerprint on real skin. It should be noted that the delay amount between the phase of the ultrasonic wave emitted from the piezoelectric material layer corresponding to the second driving electrode and the phase of the ultrasonic wave emitted from the piezoelectric material layer corresponding to the first driving electrode and the third driving electrode may be obtained by test and calculation according to actual conditions. For the specific ultrasonic focusing process, please refer to the related description of FIG. 9C.

In some embodiments, the above-described step S10020 may comprise: turning on the receiving electrode corresponding to (overlapping with) the second driving electrode according to the reflected echo time of the second driving electrode so as to receive the reflected echo. Here, the second driving electrode, the receiving electrode, and the piezoelectric material layer therebetween may constitute an ultrasonic receiving element. For example, the above-described reflected echo refers to the ultrasonic waves emitted from the second driving electrode and reflected by the fingerprint. The reflected echo time is the time when the reflected echo reaches the piezoelectric material layer.

In some embodiments, the fingerprint recognition module may further comprise a plurality of driving circuits. The plurality of driving circuits electrically connected to the plurality of receiving electrodes in a one-to-one correspondence. Each driving circuit comprises: a storage capacitor, a first thin film transistor, and a signal reading sub-circuit. The storage capacitor comprises a first electrode and a second electrode. The first thin film transistor comprises a first gate, a first source, and a first drain. For each driving circuit, a receiving electrode electrically connected to the each driving circuit, the first source, and the first electrode are connected to a storage node. That is, for each driving circuit, the receiving electrode electrically connected to the each driving circuit is electrically connected to the first source and the first electrode.

The above-described step S10020 may comprise: applying a turn-on signal to the first gate to turn on the first thin film transistor (this may eliminate an aftershock) when the driving voltage is applied to the driving electrode so as to drive the portion of the piezoelectric material layer corresponding to the driving electrode to emit the ultrasonic wave; applying a bias voltage to the first drain according to an arrival time of the ultrasonic wave being reflected back to the piezoelectric material layer so as to raise the fingerprint electrical signal on the receiving electrode, and store a raised fingerprint electrical signal in the storage capacitor; and reading out the raised fingerprint electrical signal using the signal reading sub-circuit.

In some embodiments, the driving voltage is applied to 8 to 10 driving electrodes during the applying the driving voltage to the driving electrode.

In some embodiments, in order to reduce the noise signal, when the fingerprint does not touch the fingerprint recognition module, it is possible to first emit an ultrasonic wave and receive a reflected echo to obtain a base value; then, emit an ultrasonic wave and receive a reflected echo so as to obtain a fingerprint electrical signal when the fingerprint touches the fingerprint recognition module; and subtract the base value from the fingerprint electrical signal so as to eliminate the noise influence.

Figure 19:
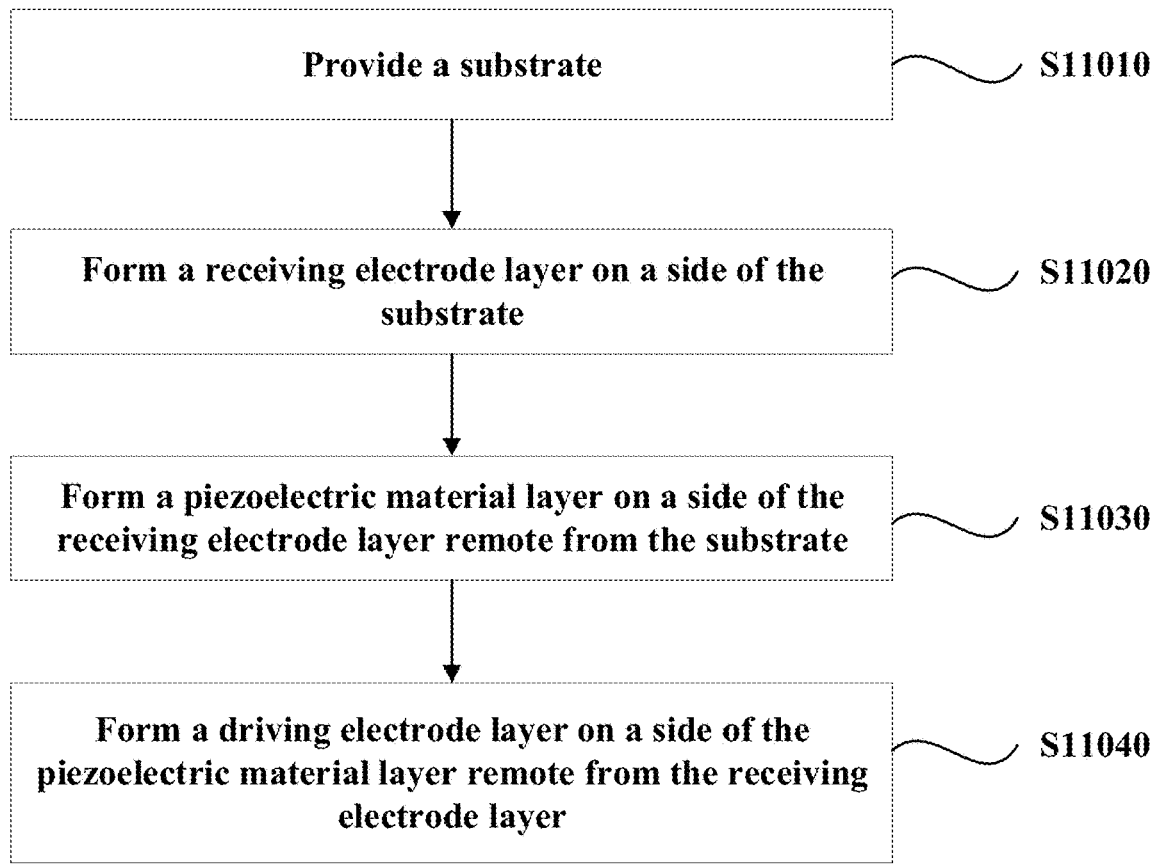
FIG. 19 is a flowchart showing a manufacturing method for a fingerprint recognition module according to an embodiment of the present disclosure.
Figure 20:
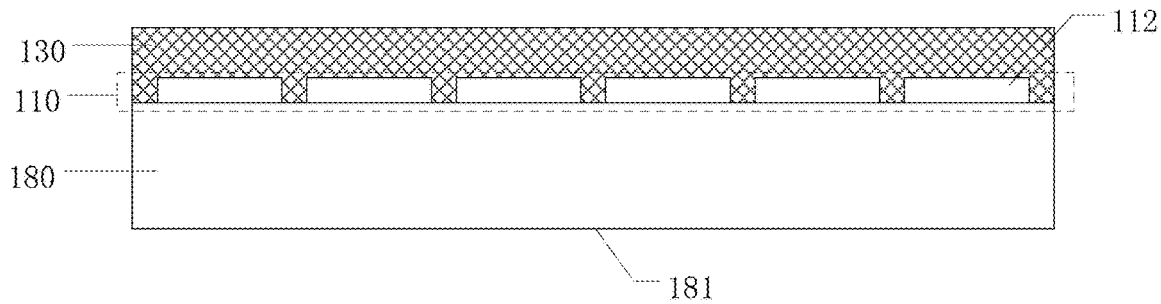
FIG. 20 is a schematic cross-sectional view showing a structure of a stage during a manufacturing process of a fingerprint recognition module according to an embodiment of the present disclosure.
Figure 21:
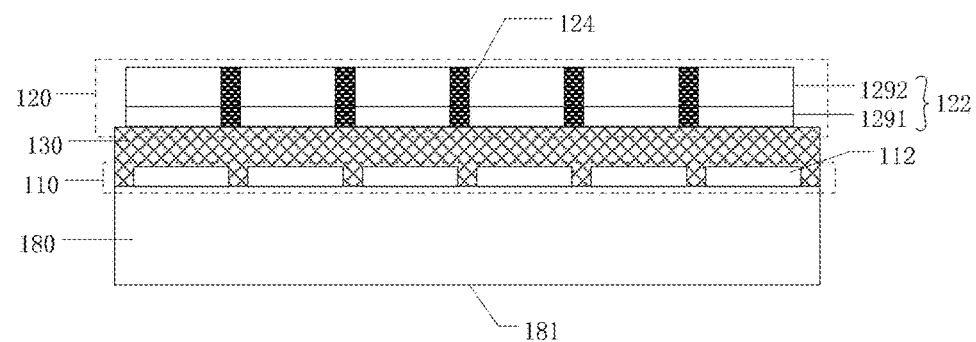
FIG. 21 is a schematic cross-sectional view showing a structure of another stage during a manufacturing process of a fingerprint recognition module according to an embodiment of the present disclosure.

FIG. 19 is a flowchart showing a manufacturing method for a fingerprint recognition module according to an embodiment of the present disclosure. FIGS. 20 to 21 are schematic cross-sectional views showing structures of several stages during a manufacturing process of a fingerprint recognition module according to an embodiment of the present disclosure. The manufacturing process of the fingerprint recognition module according to some embodiments of the present disclosure is described in detail below in conjunction with FIG. 19 and FIGS. 20 to 21. As shown in FIG. 19, the manufacturing method may comprise steps S11010 to S11040.

FIG. 19 is a flowchart showing a manufacturing method of a fingerprint recognition module according to one embodiment of the present disclosure. FIGS. 20 and 21 are schematic cross-sectional views showing a structure of several stages during a manufacturing process of a fingerprint recognition module according to one embodiment of the present disclosure. The manufacturing process of a fingerprint recognition module according to some embodiments of the present disclosure will be described in detail below in conjunction with FIG. 19 and FIGS. 20 and 21. As shown in FIG. 19, the manufacturing method may comprise steps S11010 to S11040.

As shown in FIG. 19, at step S11010, a substrate is provided. For example, as shown in FIG. 20, a substrate 180 is provided.

Returning to FIG. 19, at step S11020, a receiving electrode layer is formed on a side of the substrate. The receiving electrode layer comprises a plurality of receiving electrodes arranged in an array along a first direction and a second direction intersecting with the first direction.

For example, as shown in FIG. 20, a receiving electrode layer 110 may be formed on a side of the substrate by processes such as deposition and patterning. The receiving electrode layer 110 comprises a plurality of receiving electrodes 112 arranged in an array along a first direction and a second direction.

Returning to FIG. 19, at step S11030, a piezoelectric material layer 130 is formed on a side of the receiving electrode layer 110 remote from the substrate 180 (as shown in FIG. 20). For example, the piezoelectric material layer may comprise a piezoelectric material having a high piezoelectric voltage constant such as PVDF (polyvinylidene fluoride).

Returning to FIG. 19, at step S11040, a driving electrode layer 120 is formed on a side of the piezoelectric material layer 130 remote from the receiving electrode layer 110 (as shown in FIG. 21). The driving electrode layer 120 may comprise a plurality of driving electrodes 122 arranged along the second direction. Each of the plurality of driving electrodes 122 is a strip electrode extending along the first direction, and overlaps with multiple receiving electrodes 112 arranged along the first direction. That is, an orthographic projection of the each of the plurality of driving electrodes on the piezoelectric material layer at least partially overlaps with an orthographic projection of multiple receiving electrodes arranged along the first direction on the piezoelectric material layer.

In some embodiments, as shown in FIG. 21, this step S11040 may comprise: forming a plurality of first sub-driving electrodes 1291 by a patterning process. Each of the plurality of first sub-driving electrodes 1291 is a strip sub-electrode extending along the first direction. The step S11040 may further comprise: forming a barrier wall 124 between adjacent first sub-driving electrodes 1291. The step S11040 may further comprise: forming a plurality of second sub-driving electrodes 1292 in one-to-one correspondence with the plurality of first sub-driving electrodes 1291 on a side of the plurality of first sub-driving electrodes 1291 remote from the substrate 180 by an electroplating process. A height of the barrier wall 124 in a direction perpendicular to the driving electrode layer 120 is greater than that of the first sub-driving electrode 1291 in the direction perpendicular to the driving electrode layer 120. The plurality of first sub-driving electrodes 1291 and the plurality of second sub-driving electrodes 1292 constitute the plurality of driving electrodes 122.

In order to cause the fingerprint recognition module to have a high receiving sensitivity to an ultrasonic wave, the piezoelectric material layer is usually made of a piezoelectric material with a high piezoelectric voltage constant such as PVDF (polyvinylidene fluoride). Moreover, the piezoelectric material with a high piezoelectric voltage constant, such as PVDF (polyvinylidene fluoride), requires a high driving voltage to generate an ultrasonic wave with a high intensity. Therefore, the driving electrode needs to be made thicker, for example, its thickness is greater than 10 microns, so that it is suitable for being loaded with a higher voltage. By means of the above-described manufacturing method, the plurality of first sub-driving electrodes may be formed on a side of the piezoelectric material layer remote from the receiving electrode layer. The first sub-driving electrode need not be made thicker. For example, the thickness of the first sub-driving electrode ranges from 0.4 microns to 1 micron. Then, the plurality of second sub-driving electrodes are formed on the plurality of first sub-driving electrodes by using a barrier wall and an electroplating process, so that thick driving electrodes are obtained. It should be noted that in the electroplating process, under the effect of an electric field, the metal layer can continue to grow only on the patterned metal layer, and the barrier wall may produce a separating effect to prevent the electroplated metal layers from being connected to each other.

In some embodiments, the size of the barrier wall in the direction perpendicular to the driving electrode layer ranges from 1 micron to 20 microns, and the size of the driving electrode in the direction perpendicular to the driving electrode layer ranges from 1 micron to 20 microns. Since the driving electrode has a great thickness, the driving electrode has a small resistance. In addition, since the second sub-driving electrode formed by the electroplating process has a better surface uniformity, a better electrical performance (e.g., loading a high driving voltage) may be realized, and uniform reflection of an ultrasonic wave may also be achieved, which is favorable for recognition of the valleys and ridges of the fingerprint.

In some embodiments, a material of the driving electrode comprises one or more of copper, silver, or aluminum.

In some embodiments, a material of the barrier wall may comprise a resin material or the like, so that there may be a low cost and lower manufacturing difficulty.

In some embodiments, a materials of the first sub-driving electrode is the same as that of the second sub-driving electrode.

So far, a method manufacturing fora fingerprint recognition module according to some embodiments of the present disclosure is provided. When the fingerprint recognition module manufactured by this manufacturing method performs fingerprint recognition, the receiving electrode may be grounded, and then an alternating voltage may be applied to a plurality of driving electrodes arranged along a second direction respectively. The piezoelectric material layer corresponding to the driving electrodes may be deformed or drive the film layers above and below the piezoelectric material layer to vibrate together due to an inverse piezoelectric effect, so that an ultrasonic wave may be generated and emitted outward. Since the driving electrode layer of the fingerprint recognition module comprises a plurality of driving electrodes, a plurality of ultrasonic emitting elements described above may be constituted, so that the ultrasonic wave is focused by respectively driving the plurality of driving electrodes described above. In this way, on the one hand, the intensity or energy of the emitted ultrasonic wave in a specific area or a specific direction may be improved, thereby improving the fingerprint recognition performance; on the other hand, it is possible to cause the emitted ultrasonic wave to have a better directivity, which may reduce the crosstalk between the ultrasonic waves reflected by the valleys and ridges of the fingerprint, thereby improving the fingerprint recognition performance. When the emitted ultrasonic wave is reflected back to the fingerprint recognition module by the fingerprint, the plurality of ultrasonic receiving elements formed by the plurality of receiving electrodes may receive the reflected ultrasonic wave and convert the reflected ultrasonic wave signal into an electrical signal, thereby realizing fingerprint recognition.

On the other hand, when the fingerprint recognition module manufactured by this manufacturing method improves the intensity or energy of the emitted ultrasonic wave in a specific area or a specific direction by focusing the ultrasonic wave, the fingerprint recognition module may not only realize fingerprint recognition, but also penetrate a finger to discriminate whether the fingerprint is a fingerprint on real skin.

In some embodiments, the above-described manufacturing method may further comprise: forming a protective layer 190 on a side of the driving electrode layer 120 remote from the piezoelectric material layer 130, thereby forming the structure as shown in FIG. 5A.

(1) In the accompanying drawings of the embodiments of the present disclosure, only the structures related to the embodiments of the present disclosure are involved. For other structures, please refer to general designs.

(2) In a case where there is no conflict, the features in the same embodiment and different embodiments of the present disclosure may be combined with each other.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A fingerprint recognition module, comprising:
   a receiving electrode layer comprising a plurality of receiving electrodes arranged in an array along a first direction and a second direction intersecting with the first direction;
   a piezoelectric material layer disposed on a side of the receiving electrode layer; and a driving electrode layer disposed on a side of the piezoelectric material layer remote from the receiving electrode layer and comprising a plurality of driving electrodes arranged along the second direction,
wherein each of the plurality of driving electrodes is a strip electrode extending along the first direction, and an orthographic projection of the each of the plurality of driving electrodes on the piezoelectric material layer at least partially overlaps with an orthographic projection of multiple receiving electrodes arranged along the first direction on the piezoelectric material layer;
the plurality of receiving electrodes comprise a plurality of receiving electrode groups arranged along the second direction, wherein each of the plurality of receiving electrode groups comprises at least two receiving electrodes arranged along the first direction;
the orthographic projection of the each of the plurality of driving electrodes on the piezoelectric material layer at least partially overlaps with an orthographic projection of least two of the plurality of receiving electrode groups on the piezoelectric material layer; and
a minimum arrangement period of the plurality of driving electrodes arranged along the second direction is substantially equal to half a wavelength of an ultrasonic wave emitted from the fingerprint recognition module during operation.

2. The fingerprint recognition module according to claim 1, wherein:
the minimum arrangement period of the plurality of driving electrodes arranged along the second direction is one of a plurality of distance values that are integer multiples of a minimum arrangement period of the plurality of receiving electrodes arranged along the second direction, which is a distance value closest to half the wavelength of the ultrasonic wave emitted from the fingerprint recognition module during operation;
wherein there is a gap between adjacent receiving electrodes, and a range of a ratio R of a width of the gap along the second direction to the minimum arrangement period of the plurality of receiving electrodes arranged along the second direction is: $0 < R \leq 20\%$.

3. The fingerprint recognition module according to claim 1, wherein
a width of each of the plurality of driving electrodes along the second direction is less than or equal to half the wavelength of the ultrasonic wave emitted from the fingerprint recognition module during operation.

4. The fingerprint recognition module according to claim 1, wherein the driving electrode layer further comprises a barrier wall located between two adjacent driving electrodes.

5. The fingerprint recognition module according to claim 4, wherein a size of each of the plurality of driving electrodes in a direction perpendicular to the driving electrode layer ranges from 1 micron to 20 microns, and a size of the barrier wall in the direction perpendicular to the driving electrode layer is greater than or equal to the size of each of the plurality of driving electrodes in the direction perpendicular to the driving electrode layer.

6. The fingerprint recognition module according to claim 1, wherein the piezoelectric material layer comprises a plurality of sub-piezoelectric material layers arranged along the second direction,
wherein the plurality of sub-piezoelectric material layers are disposed in one-to-one correspondence with the plurality of driving electrodes.

7. The fingerprint recognition module according to claim 1, further comprising:
a reflective layer located on a side of the driving electrode layer remote from the piezoelectric material layer; and
an insulating layer located between the reflective layer and the driving electrode layer.

8. The fingerprint recognition module according to claim 1, wherein
each of the plurality of driving electrodes comprises a first sub-driving electrode in contact with the piezoelectric material layer and a second sub-driving electrode on a side of the first sub-driving electrode remote from the piezoelectric material layer, wherein a thickness of the first sub-driving electrode is less than a thickness of the second sub-driving electrode.

9. The fingerprint recognition module according to claim 1, further comprising: a plurality of driving circuits electrically connected to the plurality of receiving electrodes in a one-to-one correspondence, wherein each of the plurality of driving circuits comprises:
a storage capacitor comprising a first electrode and a second electrode;
a first thin film transistor comprising a first gate, a first source, and a first drain; and
a signal reading sub-circuit, configured to read a fingerprint electrical signal stored in the storage capacitor,
wherein for each driving circuit, a receiving electrode electrically connected to the each driving circuit is electrically connected to the first source and the first electrode.

10. The fingerprint recognition module according to claim 9, wherein the signal reading sub-circuit comprises:
a second thin film transistor comprising a second gate electrically connected to the first electrode of the storage capacitor, a second source configured to receive a fixed voltage, and a second drain; and
a third thin film transistor, comprising a third gate configured to receive a read instruction signal, a third source electrically connected to the second drain, and a third drain configured to output an electric signal corresponding to the fingerprint electrical signal.

11. The fingerprint recognition module according to claim 10, further comprising:
a plurality of multiplexers, each of which is configured to select and output the electrical signal corresponding to the fingerprint electrical signal;
a plurality of groups of data signal lines, each of which comprises multiple data signal lines, wherein the plurality of groups of data signal lines are electrically connected to the plurality of multiplexers in one-to-one correspondence, and each of the multiple data signal lines is electrically connected to third drains of third thin film transistors of a plurality of driving circuits arranged along the first direction;
a control circuit electrically connected to the plurality of multiplexers and configured to control the plurality of multiplexers to select and output the electrical signal corresponding to the fingerprint electrical signal;
a plurality of gate lines, each of which is electrically connected to third gates of third thin film transistors of a plurality of driving circuits arranged along the second direction; and
a gate driving circuit electrically connected to the plurality of gate lines and configured to provide the read instruction signal.

12. The fingerprint recognition module according to claim 10, further comprising:

a plurality of gate driving circuits, each of which is configured to provide the read instruction signal;

a plurality of groups of gate lines, each of which comprises a plurality of gate lines, wherein the plurality of groups of gate lines are electrically connected to the plurality of gate driving circuits in one-to-one correspondence, and each of the plurality of gate lines is electrically connected to third gates of third thin film transistors of a plurality of driving circuits arranged along the first direction; and a plurality of data signal lines, each of which is electrically connected to third drains of third thin film transistors of a plurality of driving circuits arranged along the second direction.

13. A display device, comprising: the fingerprint recognition module according to claim 1.

14. A driving method for a fingerprint recognition module, the fingerprint recognition module comprising: a receiving electrode layer comprising a plurality of receiving electrodes arranged in an array along a first direction and a second direction intersecting with the first direction; a piezoelectric material layer disposed on a side of the receiving electrode layer; and a driving electrode layer disposed on a side of the piezoelectric material layer remote from the receiving electrode layer and comprising a plurality of driving electrodes arranged along the second direction, wherein each of the plurality of driving electrodes is a strip electrode extending along the first direction, and an orthographic projection of the each of the plurality of driving electrodes on the piezoelectric material layer at least partially overlaps with an orthographic projection of multiple receiving electrodes arranged along the first direction on the piezoelectric material layer; the plurality of receiving electrodes comprise a plurality of receiving electrode groups arranged along the second direction, wherein each of the plurality pf receiving electrode groups comprises at least two receiving electrodes arranged along the first direction; and the orthographic projection of the each of the plurality of driving electrodes on the piezoelectric material layer at least partially overlaps with an orthographic projection of least two of the plurality of receiving electrode groups on the piezoelectric material layer; a minimum arrangement period of the plurality of driving electrodes arranged along the second direction is substantially equal to half a wavelength of an ultrasonic wave emitted from the fingerprint recognition module during operation; and the driving method comprising:

applying a driving voltage to a driving electrode so as to drive a portion of the piezoelectric material layer corresponding to the driving electrode to emit an ultrasonic wave; and receiving the ultrasonic wave reflected by a fingerprint using the piezoelectric material layer and outputting a corresponding fingerprint electrical signal by a receiving electrode.

15. The driving method for the fingerprint recognition module according to claim 14, wherein the plurality of driving electrodes comprise a first driving electrode and a second driving electrode, and the driving method comprises:

applying the driving voltage to the first driving electrode at a first time point so as to drive a portion of the piezoelectric material layer corresponding to the first driving electrode to emit an ultrasonic wave; and applying the driving voltage to the second driving electrode at a second time point after the first time point so as to drive a portion of the piezoelectric material layer corresponding to the second driving electrode to emit an ultrasonic wave, a phase of which is delayed from a phase of the ultrasonic wave emitted from the portion of the piezoelectric material layer corresponding to the first driving electrode.

16. The driving method for the fingerprint recognition module according to claim 14, wherein the plurality of driving electrodes comprise a first driving electrode, a second driving electrode, and a third driving electrode, the second driving electrode is located between the first driving electrode and the third driving electrode, and the driving method comprises:

applying the driving voltage to the first driving electrode and the third driving electrode at the first time point so as to drive a portion of the piezoelectric material layer corresponding to the first driving electrode and the third driving electrode to emit an ultrasonic wave; and applying the driving voltage to the second driving electrode at the second time point so as to drive a portion of the piezoelectric material layer corresponding to the second driving electrode to emit an ultrasonic wave, a phase of which is delayed from a phase of the ultrasonic wave emitted from the portion of the piezoelectric material layer corresponding to the first driving electrode and the third driving electrode.

17. The driving method for the fingerprint recognition module according to claim 14, wherein the fingerprint recognition module further comprises: a plurality of driving circuits electrically connected to the plurality of receiving electrodes in a one-to-one correspondence, and each of the plurality of driving circuits comprises: a storage capacitor comprising a first electrode and a second electrode; a first thin film transistor comprising a first gate, a first source, and a first drain; and a signal reading sub-circuit, wherein for each driving circuit, a receiving electrode electrically connected to the each driving circuit is electrically connected to the first source and the first electrode, and wherein the receiving the ultrasonic wave reflected by the fingerprint using the piezoelectric material layer and outputting the corresponding fingerprint electrical signal through the receiving electrode comprises:

applying a turn-on signal to the first gate to turn on the first thin film transistor when the driving voltage is applied to the driving electrode so as to drive the portion of the piezoelectric material layer corresponding to the driving electrode to emit the ultrasonic wave;

applying a bias voltage to the first drain according to an arrival time of the ultrasonic wave being reflected back to the piezoelectric material layer so as to raise the fingerprint electrical signal on the receiving electrode, and store a raised fingerprint electrical signal in the storage capacitor; and reading out the raised fingerprint electrical signal using the signal reading sub-circuit.

18. A manufacturing method for a fingerprint recognition module, comprising:

providing a substrate;

forming a receiving electrode layer on a side of the substrate, wherein the receiving electrode layer comprises a plurality of receiving electrodes arranged in an array along a first direction and a second direction intersecting with the first direction;

forming a piezoelectric material layer on a side of the receiving electrode layer remote from the substrate; and forming a driving electrode layer on a side of the piezoelectric material layer remote from the receiving electrode layer, wherein the driving electrode layer comprises a plurality of driving electrodes arranged along the second direction, wherein each of the plurality of driving electrodes is a strip electrode extending along the first direction, and an orthographic projection of the each of the plurality of driving electrodes on the piezoelectric material layer at least partially overlaps with an orthographic projection of multiple receiving electrodes arranged along the first direction on the piezoelectric material layer; the plurality of receiving electrodes comprise a plurality of receiving electrode groups arranged along the second direction, wherein each of the plurality of receiving electrode groups comprises at least two receiving electrodes arranged along the first direction; and the orthographic projection of the each of the plurality of driving electrodes on the piezoelectric material layer at least partially overlaps with an orthographic projection of least two of the plurality of receiving electrode groups on the piezoelectric material layer; a minimum arrangement period of the plurality of driving electrodes arranged along the second direction is substantially equal to half a wavelength of an ultrasonic wave emitted from the fingerprint recognition module during operation.

* * * * *

UNITED STATES PATENT AND TRADEMARK OFFICE
CERTIFICATE OF CORRECTION

PATENT NO. : 11,487,389 B2
APPLICATION NO. : 16/642804
DATED : November 1, 2022
INVENTOR(S) : Yuzhen Guo et al.

Page 1 of 1

It is certified that error appears in the above-identified patent and that said Letters Patent is hereby corrected as shown below:

In the Claims

Column 33, Line 35, Claim 14, delete "pf" and insert -- of --

Signed and Sealed this
Second Day of January, 2024

Katherine Kelly Vidal
*Director of the United States Patent and Trademark Office*